US010083967B2

(12) United States Patent
Cartier et al.

(10) Patent No.: US 10,083,967 B2
(45) Date of Patent: Sep. 25, 2018

(54) NON-VOLATILE MEMORY DEVICE EMPLOYING A DEEP TRENCH CAPACITOR

(71) Applicant: GLOBALFOUNDRIES INC., Grand Cayman (KY)

(72) Inventors: Eduard A. Cartier, New York, NY (US); Herbert L. Ho, New Windsor, NY (US); Donghun Kang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/665,979

(22) Filed: Aug. 1, 2017

(65) Prior Publication Data

US 2017/0358581 A1    Dec. 14, 2017

Related U.S. Application Data

(62) Division of application No. 14/452,762, filed on Aug. 6, 2014, now Pat. No. 9,754,945.

(51) Int. Cl.
*H01L 21/02* (2006.01)
*H01L 21/8242* (2006.01)
(Continued)

(52) U.S. Cl.
CPC ...... *H01L 27/1087* (2013.01); *H01L 27/1082* (2013.01); *H01L 27/10832* (2013.01);
(Continued)

(58) Field of Classification Search
CPC ............... H01L 27/108; H01L 27/1082; H01L 27/10829–27/10841; H01L 27/10808;
(Continued)

(56) References Cited

U.S. PATENT DOCUMENTS 4,342,928 A    8/1982  Gschendtner et al.
4,745,959 A    5/1988  Rist
(Continued)

OTHER PUBLICATIONS

Office Action dated Dec. 7, 2015 from parent U.S. Appl. No. 14/452,762.
(Continued)

*Primary Examiner* — Natalia Gondarenko
(74) *Attorney, Agent, or Firm* — Scully, Scott, Murphy & Presser, PC

(57) ABSTRACT

A non-volatile memory device with a programmable leakage can be formed employing a trench capacitor. After formation of a deep trench, a metal-insulator-metal stack is formed on surfaces of the deep trench employing a dielectric material that develops leakage path filaments upon application of a programming bias voltage. A set of programming transistors and a leakage readout device can be formed to program, and to read, the state of the leakage level. The non-volatile memory device can be formed concurrently with formation of a dynamic random access memory (DRAM) device by forming a plurality of deep trenches, depositing a stack of an outer metal layer and a node dielectric layer, patterning the node dielectric layer to provide a first node dielectric for each non-volatile memory device that is thinner than a second node dielectric for each DRAM device, and forming an inner metal layer.

8 Claims, 16 Drawing Sheets

(51) Int. Cl.
*H01L 29/92* (2006.01)
*H01L 27/108* (2006.01)
*H01L 49/02* (2006.01)
*H01L 21/764* (2006.01)

(52) U.S. Cl.
CPC .. *H01L 27/10858* (2013.01); *H01L 27/10867* (2013.01); *H01L 27/10873* (2013.01); *H01L 27/10882* (2013.01); *H01L 28/91* (2013.01)

(58) Field of Classification Search
CPC .... H01L 27/10861–27/1087; H01L 27/10867; H01L 27/10858; H01L 27/10876; H01L 27/10882; H01L 28/91; H01L 2924/1436; H01L 29/945; H01L 21/76897; H01L 27/10873; H01L 27/10852; H01L 27/10855; H01L 27/10844; H01L 27/10847; H01L 27/1085; H01L 27/1052; H01L 27/10805; H01L 27/10823; H01L 27/10894; H01L 27/105
USPC ........... 257/301, 303, 304, E21.09, E21.295, 257/E27.016, E21.646; 438/155, 210, 438/243, 244, 29, 381, 386, 396, 652
See application file for complete search history.

(56) References Cited

U.S. PATENT DOCUMENTS

| | | | |
|---|---|---|---|
| 4,746,959 A | | 5/1988 | Mueller |
| 4,794,434 A | * | 12/1988 | Pelley, III ......... H01L 27/10829 257/301 |
| 6,115,283 A | | 9/2000 | Hidaka |
| 6,570,207 B2 | | 5/2003 | Hsu et al. |
| 7,719,041 B2 | | 5/2010 | Abdul-Ridha et al. |
| 7,965,540 B2 | | 6/2011 | Cannon et al. |
| 8,178,944 B2 | | 5/2012 | Xia et al. |
| 8,191,217 B2 | | 6/2012 | Dunn et al. |
| 8,314,452 B2 | | 11/2012 | Riess et al. |
| 8,357,991 B2 | | 1/2013 | Oshida et al. |
| 8,375,539 B2 | | 2/2013 | Dunn et al. |
| 8,399,318 B2 | | 3/2013 | Lin et al. |
| 8,455,977 B2 | | 6/2013 | Xia et al. |
| 8,564,089 B2 | | 10/2013 | Kurz et al. |
| 8,574,975 B2 | | 11/2013 | Kim |
| 2007/0057302 A1 | | 3/2007 | Ho et al. |
| 2010/0200950 A1 | | 8/2010 | Kim et al. |
| 2011/0019321 A1 | | 1/2011 | Chen et al. |
| 2011/0097843 A1 | | 4/2011 | Jin et al. |
| 2011/0133310 A1 | * | 6/2011 | Anderson ......... H01L 21/76224 257/532 |
| 2011/0169065 A1 | | 7/2011 | Cheng et al. |
| 2011/0272702 A1 | * | 11/2011 | Kwon ............... H01L 27/10867 257/71 |
| 2013/0134491 A1 | * | 5/2013 | Messenger ............. H01L 21/84 257/301 |
| 2014/0231958 A1 | | 8/2014 | Lim et al. |

OTHER PUBLICATIONS

Final Office Action dated May 5, 2017 from parent U.S. Appl. No. 14/452,762.

Office Action dated Dec. 29, 2016 from parent U.S. Appl. No. 14/452,762.

Notice of Allowance dated May 4, 2017 from parent U.S. Appl. No. 14/452,762.

* cited by examiner

NON-VOLATILE MEMORY DEVICE EMPLOYING A DEEP TRENCH CAPACITOR

BACKGROUND

The present disclosure relates to a semiconductor structure, and particularly to a semiconductor structure including a non-volatile semiconductor memory device that employs a deep trench capacitor having a programmable leakage level, and a method of manufacturing the same.

Dynamic random access memory (DRAM) devices are volatile memory devices employing a capacitor as a charge storage device. Due to inherent leakage in the capacitor, the electrical charge in DRAM devices needs to be periodically refreshed to preserve the contents of the data stored in the capacitors. While static random access memory (SRAM) devices are non-volatile memory devices that do not require periodic refreshing of stored data, operation of the SRAM devices induces stand-by power consumption even when the contents of the SRAM devices are not accessed.

In view of the above, there exists a need for a non-volatile memory device that minimizes power consumption in a stand-by mode.

SUMMARY

A non-volatile memory device with a programmable leakage can be formed employing a trench capacitor. After formation of a deep trench, a metal-insulator-metal stack is formed on surfaces of the deep trench employing a dielectric material that develops leakage path filaments upon application of a programming bias voltage. A set of programming transistors and a leakage readout device can be formed to program, and to read, the state of the leakage level. The non-volatile memory device can be formed concurrently with formation of a dynamic random access memory (DRAM) device by forming a plurality of deep trenches, depositing a stack of an outer metal layer and a node dielectric layer, patterning the node dielectric layer to provide a first node dielectric for each non-volatile memory device that is thinner than a second node dielectric for each DRAM device, and forming an inner metal layer.

According to an aspect of the present disclosure, a semiconductor structure includes a trench capacitor and a set of switching devices. The trench capacitor includes an outer metallic layer, a node dielectric layer, and an inner metallic layer and is located within a semiconductor substrate. The set of switching devices is configured to provide a selected state from among three states based on a set of input signals. The three states includes a first state in which the inner metallic layer is electrically shorted to a positive power supply voltage; a second state in which the inner metallic layer is electrically shorted to a negative power supply voltage; and a third state in which the inner metallic layer is electrically isolated from any node having the positive power supply voltage and from any node having the negative power supply voltage.

According to another aspect of the present disclosure, a method of forming a semiconductor structure is provided. A first trench and a second trench are formed in a semiconductor substrate. A first outer metallic layer is formed in the first trench and a second outer metallic layer is formed in the second trench. A contiguous node dielectric layer is formed on the first and second outer metallic layers. A first portion of the contiguous node dielectric layer in the first trench is thinned, while a second portion of the contiguous node dielectric layer remains in the second trench without a change of thickness. A first inner metallic layer and a second inner metallic layer are formed on the first and second portions of the contiguous node dielectric layer, respectively.

DETAILED DESCRIPTION

Figure 1:
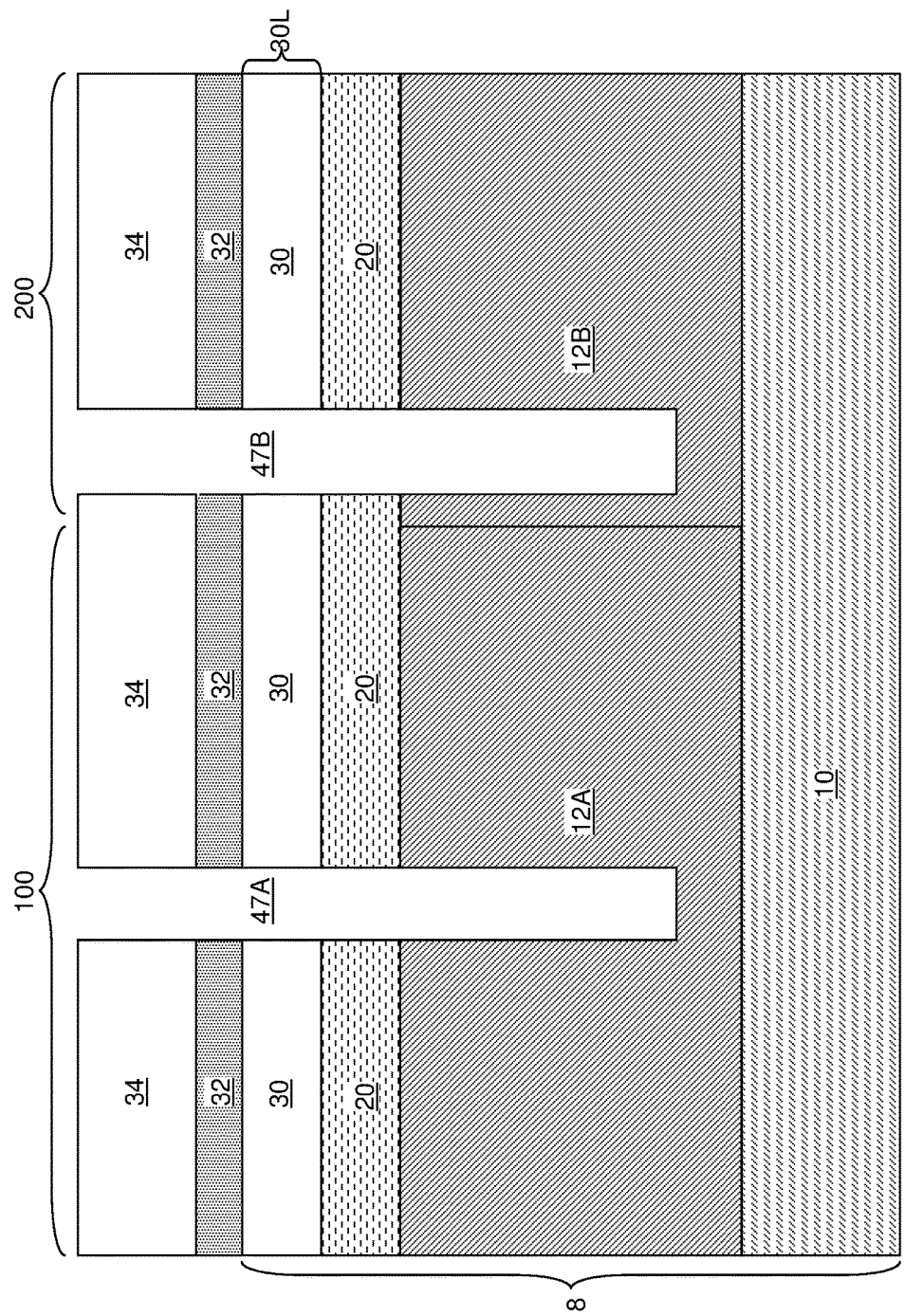
FIG. 1 is a vertical cross-sectional view of an exemplary semiconductor structure after formation of deep trenches in a semiconductor substrate according to an embodiment of the present disclosure.

As stated above, the present disclosure relates to a semiconductor structure including a non-volatile semiconductor memory device that employs a deep trench capacitor having a programmable leakage level, and a method of manufacturing the same, which are now described in detail with accompanying figures. Aspects of the present disclosure are now described in detail with accompanying figures. It is noted that like and corresponding elements are referred to by like reference numerals. The drawings are not drawn to scale. Ordinals are used merely to distinguish among similar elements, and different ordinals may be employed across the specification and the claims of the instant application.

As used herein, a "deep trench" refers to a trench that extends from a topmost surface of a semiconductor-on-insulator (SOI) substrate through a top semiconductor layer and a buried insulator layer and partly into an underlying semiconductor layer or a trench that extends from a topmost surface of a bulk semiconductor substrate to a depth greater than 2 microns. A "deep capacitor trench" refers to a deep trench on which a capacitor is formed. A "deep trench capacitor" refers to a capacitor formed within a deep trench.

Referring to FIG. 1, an exemplary semiconductor structure includes a semiconductor substrate 8, a hard mask layer 32, and a trench etch mask layer 34. The semiconductor substrate 8 may be a semiconductor-on-insulator (SOI) substrate including a stack, from bottom to top, of a bottom semiconductor layer 10, a buried insulator layer 20, and a top semiconductor layer 30L. Alternately, the semiconductor substrate 8 may be a bulk semiconductor substrate including at least one semiconductor material that extends throughout the entirety of the bulk semiconductor substrate.

In case the semiconductor substrate 8 is an SOI substrate, each of the bottom semiconductor layer 10, the buried insulator layer 20, and the top semiconductor layer 30L can be provided as an unpatterned layer having a uniform thickness throughout. The bottom semiconductor layer 10 includes a first semiconductor material, which can be an elemental semiconductor material or an alloy of at least two elemental semiconductor materials, or can be a compound semiconductor material or an alloy of at least two compound semiconductor materials. The bottom semiconductor layer 10 can be single crystalline or polycrystalline. In one embodiment, the bottom semiconductor layer 10 can include single crystalline silicon. In one embodiment, the bottom semiconductor layer 10 can have a doping of a first conductivity type. The dopant concentration in the bottom semiconductor layer 10 can be, for example, from $1.0\times10^{14}/cm^3$ to $1.0\times10^{18}/cm^3$, although lesser and greater dopant concentrations can also be employed.

The buried insulator layer 30L includes a dielectric material such as silicon oxide, silicon nitride, a dielectric metal oxide, or a combination thereof. The thickness of the buried insulator layer 30L can be in a range from 10 nm to 1,000 nm, although lesser and greater thicknesses can also be employed.

The top semiconductor layer 30L includes a semiconductor material, which can be the same as, or different from, the first semiconductor material. The semiconductor material of the top semiconductor layer 30L is herein referred to as a second semiconductor material. In one embodiment, the thickness of the top semiconductor layer 30L can be in a range from 5 nm to 300 nm, although lesser and greater thicknesses can also be employed.

The first semiconductor material and the second semiconductor material can be independently selected from elemental semiconductor materials (e.g., silicon, germanium, carbon, or alloys thereof), III-V semiconductor materials, or II-VI semiconductor materials. Each semiconductor material for the bottom semiconductor layer and the top semiconductor layer 30L can be independently single crystalline, polycrystalline, or amorphous. In one embodiment, the bottom semiconductor layer 10 and the top semiconductor layer 30L can include single crystalline silicon.

A hard mask layer 32 is formed on the top surface of the semiconductor substrate 8, for example, by chemical vapor deposition (CVD) or atomic layer deposition (ALD). The hard mask layer 32 can include silicon nitride, a dielectric metal nitride, doped or undoped silicon oxide, or a stack thereof. The thickness of the hard mask layer 32 can be from 50 nm to 200 nm, although lesser and greater thicknesses can also be employed. The hard mask layer 32 can be formed as a blanket material layer having a same thickness throughout.

A trench etch mask layer 34 can be formed on the top surface of the hard mask layer 32, for example, by chemical vapor deposition (CVD). The trench etch mask layer 34 can include doped or undoped silicon oxide, a dielectric metal oxide, a dielectric metal nitride, or a stack thereof. The thickness of the trench etch mask layer 34 can be from 200 nm to 1,000 nm, although lesser and greater thicknesses can also be employed. The trench etch mask layer 34 can be formed as a blanket material layer having a same thickness throughout. The material of the trench etch mask layer 34 can be selected to be different from the material of the hard mask layer 32. For example, the hard mask layer 32 can include silicon nitride and the trench etch mask layer 34 can include silicon oxide.

A photoresist layer (not shown) can be applied over the trench etch mask layer 34, and lithographically patterned to form openings therein. The locations of the openings are selected to correspond to the locations of deep trenches to be subsequently formed in the upper portion of the semiconductor substrate 8. The pattern in the photoresist layer can be transferred into the trench etch mask layer 34 by an anisotropic etch. Optionally, the pattern in the photoresist layer can be transferred through the hard mask layer 32 prior to removal of the photoresist layer, for example, by ashing.

The pattern in the trench etch mask layer 34 is transferred into the semiconductor substrate 8 by an anisotropic etch that employs the trench etch mask layer 34 as an etch mask. At least one first trench 47A is formed in a first device region 100, and at least one second trench 47B is formed in a second device region 200. The trench etch mask layer 34 may be consumed partially or completely during the anisotropic etch that forms the first and second trenches (47A, 47B). If any portion of the trench mask layer 34 remains after the anisotropic etch, the remaining portion of the trench mask layer 34 can be removed by a subsequent etch, which can be another anisotropic etch or an isotropic etch.

If the semiconductor substrate 8 is an SOI substrate, each first trench 47A and each second trench 47B extend through the top semiconductor layer 30L, the buried insulator layer 20, and into an upper portion of the bottom semiconductor layer 10. If the semiconductor substrate 8 is a bulk semiconductor substrate, each first trench 47A and each second trench 47B extend into the bulk semiconductor substrate such that the depth of each trench (47A, 47B) is greater than 2 microns. As such, each first trench 47A and each second trench 47B is a deep trench.

The remaining semiconductor material portions of the top semiconductor layer 30L constitutes a single semiconductor material portion, which is herein referred to as a contiguous semiconductor material portion 30.

Buried plates (12A, 12B) can be formed from surface portions of the bottom semiconductor layer 10 by introducing dopants of an opposite conductivity type than the type of doping of the bottom semiconductor layer 10. The conductivity type of the doping in the buried plates (12A, 12B) is herein referred to as a second conductivity type. The second conductivity type is the opposite of the first conductivity type. For example, if the first conductivity type is p-type, the second conductivity type is n-type, and vice versa. The introduction of dopants of the second conductivity type to form the buried plates (12A, 12B) can be performed employing any method known in the art including, but not limited to, outdiffusion of dopants from a disposable doped silicate glass such as arsenosilicate glass (ASG), angled ion implantation, gas phase doping, and plasma implantation. The buried plates (12A, 12B) include at least one first buried plate 12A formed in the first device region 100 and at least one second buried plate 12B formed in the second device region 200. A first buried plate 12A can be formed on sidewalls of each first trench 47A below the buried insulator layer 20, and a second buried plate 12B can be formed on sidewalls of each second trench 47B below the buried insulator layer 20.

Figure 2:
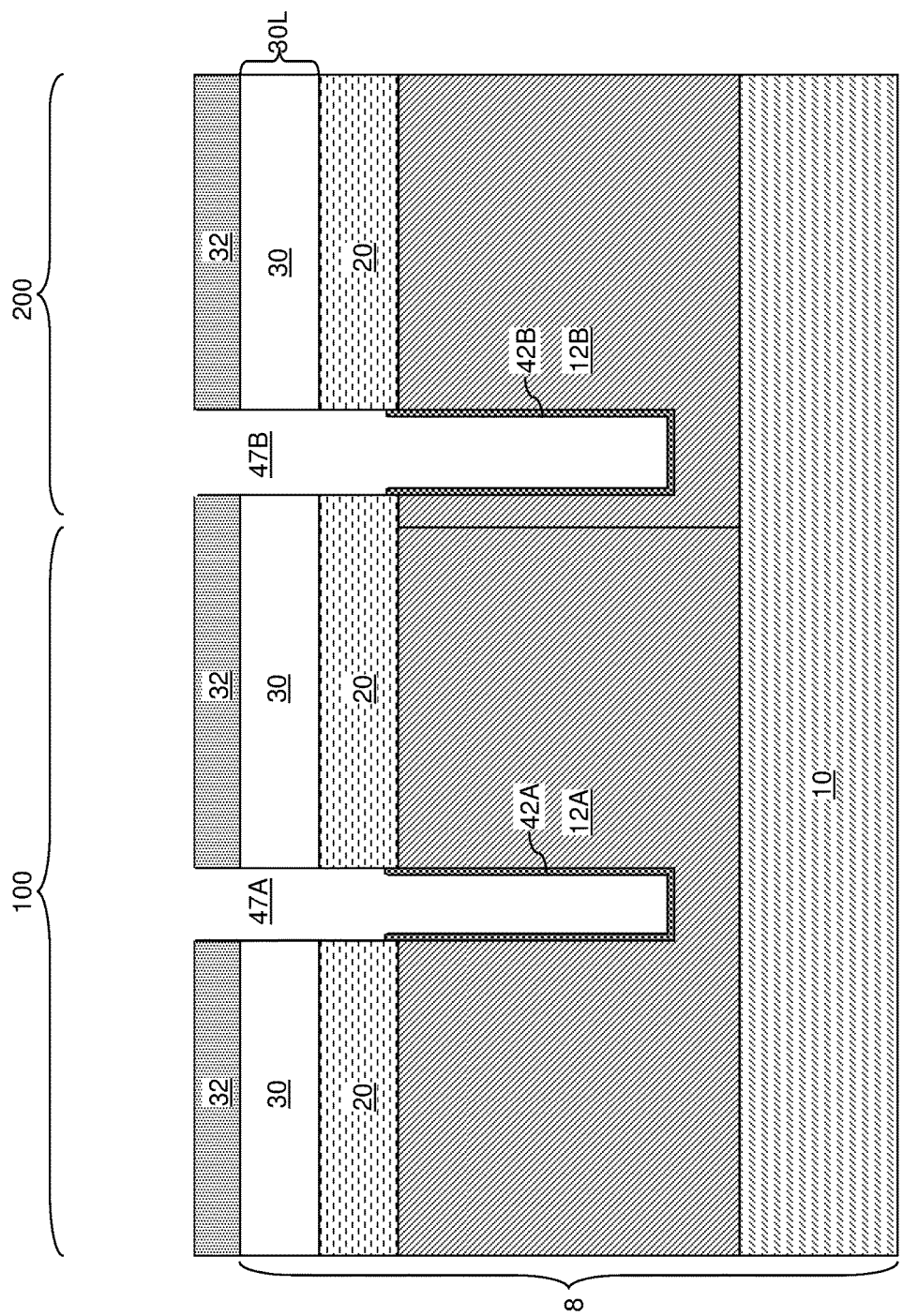
FIG. 2 is a vertical cross-sectional view of the exemplary semiconductor structure after formation of outer metallic layers in the deep trenches according to an embodiment of the present disclosure.

Referring to FIG. 2, a first metallic material is deposited as a contiguous layer on sidewalls of the first and second trenches (47A, 47B), and is patterned to form various outer metallic layers (42A, 42B). In one embodiment, the first metallic material can include an elemental metal, an alloy of at least two elemental metals, a conductive metallic nitride of an elemental metal, or a conductive metallic nitride of an alloy of at least two elemental metals. In one embodiment, the first metallic material can consist essentially of an elemental metal, an alloy of at least two elemental metals, a conductive metallic nitride of an elemental metal, or a conductive metallic nitride of an alloy of at least two elemental metals. In one embodiment, the first metallic material can include Ti, Ta, W, TiN, TaN, WN, an alloy thereof, and/or a combination thereof. In one embodiment, the first metallic material can consist essentially of Ti, Ta, W, TiN, TaN, WN, an alloy thereof, or a combination thereof. In one embodiment, the first metallic material can be deposited employing a conformal deposition method such as chemical vapor deposition (CVD) or atomic layer deposition (ALD). In one embodiment, the entirety of the contiguous layer including the first metallic material can be conformal, i.e., has the same thickness throughout. The thickness of the contiguous layer of the first metallic layer, i.e., the first contiguous metallic layer, can be in a range from 5 nm to 30 nm, although lesser and greater thicknesses can also be employed.

The outer metallic layers (42A, 42B) include at least one first outer metallic layer 42A formed in the first device region 100 and at least one second outer metallic layer 42B formed in the second device region 200. The outer metallic layers (42A, 42B) can be formed by applying a disposable masking material such as a photoresist material into the trenches (47A, 47B) after formation of the contiguous layer of the first metallic material, by recessing the disposable masking material to a height below the top surface of the buried insulator layer 20, and by removing physically exposed portions of the contiguous layer of the first metallic material from above the recessed surfaces of the disposable masking material. The remainder of the disposable masking material can be removed, for example, by ashing. Each remaining portion of the contiguous layer of the first metallic material in the first device region 100 constitutes a first outer metallic layer 42A. Each remaining portion of the contiguous layer of the first metallic material in the second device region 200 constitutes a second outer metallic layer 42B. A first outer metallic layer 42A can contact all inner sidewalls of a first buried plate 12A, and a second outer metallic layer 42B can contact all inner sidewalls of a second buried plate 12B. The at least one first outer metallic layer 42A and the at least one second outer metallic layer 42B can have the same thickness (which is herein referred to as a first thickness) and the same composition (which is herein referred to as a first composition).

Figure 3:
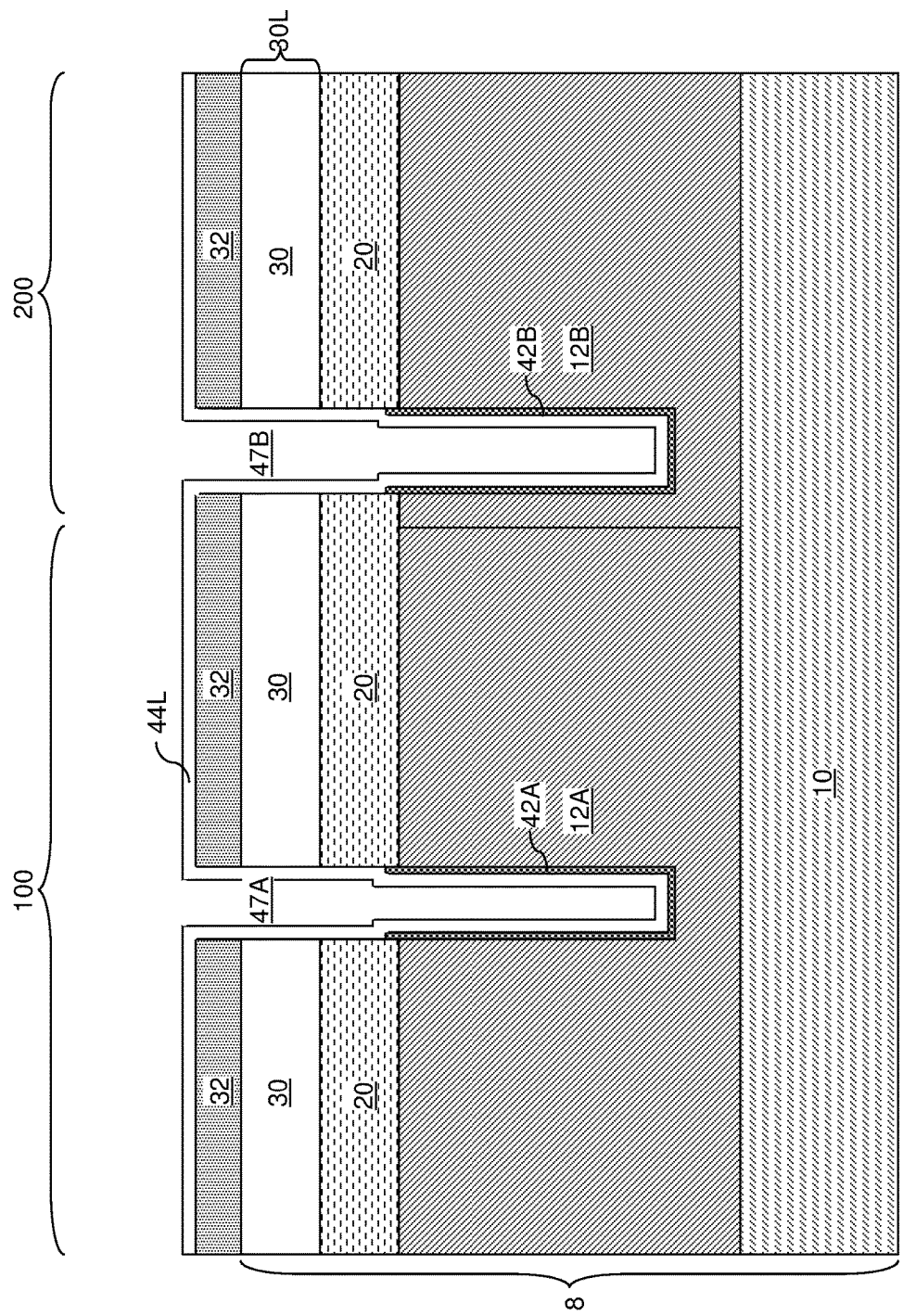
FIG. 3 is a vertical cross-sectional view of the exemplary structure after formation of a contiguous node dielectric layer according to an embodiment of the present disclosure.

Referring to FIG. 3, a contiguous node dielectric layer 44L can be deposited conformally on all physically exposed sidewalls in the at least one first trench 47A and the at least one second trench 47B and the top surface and sidewalls of the hard mask layer 32. The contiguous node dielectric layer 44L can include a dielectric metal oxide having a dielectric constant greater than 8.0, which is commonly known in the art as a high dielectric constant (high-k) dielectric material. Additionally or alternately, the contiguous node dielectric layer 44L can include a dielectric silicate of at least one metallic element.

Exemplary materials that can be employed for the contiguous node dielectric layer 44L include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the material of the contiguous node dielectric layer 44L can be selected from $HfO_2$, $ZrO_2$, $La_2O_3$, $TiO_2$, $HfO_xN_y$, $ZrO_xN_y$, $La_2O_xN_y$, $TiO_xN_y$, a silicate thereof, and an alloy thereof. In another embodiment, the material of the contiguous node dielectric layer 44L can be selected from $HfO_2$, $ZrO_2$, $HfO_xN_y$, $ZrO_xN_y$, a silicate thereof, and an alloy thereof. In yet another embodiment, the material of the contiguous node dielectric layer 44L can be selected from $HfO_2$ and a silicate of $HfO_2$.

The contiguous node dielectric layer 44L can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The thickness of the contiguous node dielectric layer 44L can be in a range from 3 nm to 12 nm, although lesser and greater thicknesses can also be employed.

Figure 4:
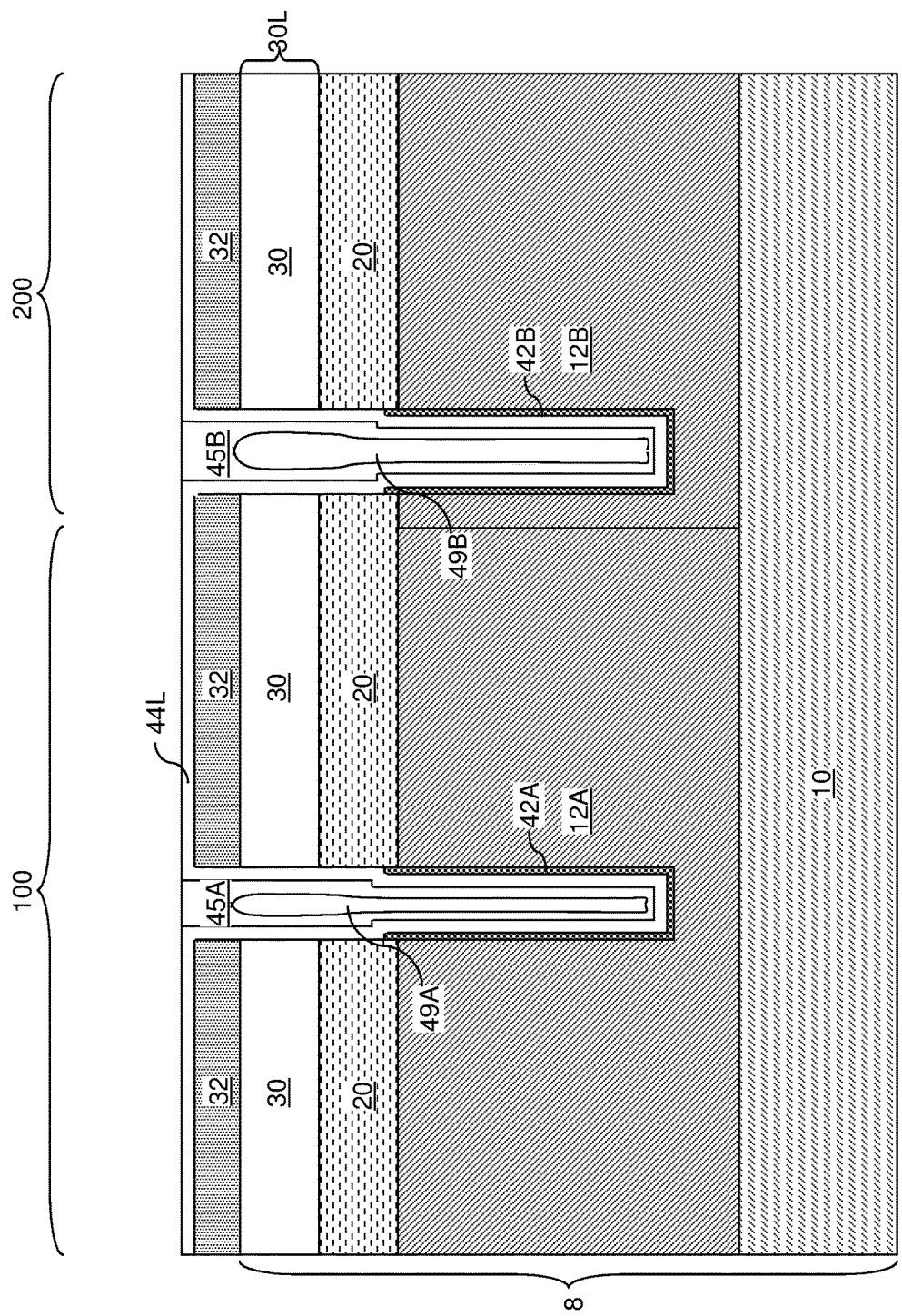
FIG. 4 is a vertical cross-sectional view of the exemplary semiconductor structure after formation of cavity-containing plug structures in the deep trenches according to an embodiment of the present disclosure.

Referring to FIG. 4, a material that can be removed selective to the materials of the hard mask layer 32 and the contiguous node dielectric layers 44L can be non-conformally deposited into the trenches (47A, 47B) such that cavities (49A, 49B) are formed within the trenches (47A, 47B; See FIG. 1). In one embodiment, the non-conformally deposited material can enclose a first cavity 49A in each first trench 47A and enclose a second cavity 49B in each second cavity 47B.

In one embodiment, the non-conformally deposited material can be a dielectric material that is different from the dielectric materials of the hard mask layer 32 and the contiguous node dielectric layer 44L. In one embodiment, the hard mask layer 32 can include silicon nitride and the non-conformally deposited material can be borosilicate glass (BSG), phosphosilicate glass (PSG), fluorosilicate glass (FSG), or undoped silicate glass (USG). In this case, BSG, PSG, FSG, or USG can be etched by a hydrofluoric acid-including etchant at an etch rate at least five times the etch rate of the undoped silicate glass or the thermal oxide while silicon nitride remains intact. The non-conformal deposition of the dielectric material can be performed, for example, by plasma enhanced chemical vapor deposition (PECVD) or high density plasma chemical vapor deposition (HDPCVD). Because typical deep trenches have an aspect ratio greater than 10, the cavity (49A, 49B) can be formed within each trench (47A, 47B).

The portions of the non-conformally deposited dielectric material above a horizontal plane including the topmost surface of the contiguous node dielectric layer 44L can be removed, for example, by a recess etch, chemical mechanical planarization (CMP), or a combination thereof. The non-conformally deposited material can be planarized, for example, by chemical mechanical planarization (CMP), a recess etch, or a combination thereof by employing the contiguous node dielectric layer 44L as a stopping layer. Remaining portions of the non-conformally deposited material in the first and second trenches (47A, 47B) constitute first and second cavity-containing plug structures (45A, 45B), respectively. Specifically, each remaining portion of the non-conformally deposited dielectric material in a first trench 47A constitutes a first cavity-containing plug structure 45A, and each remaining portion of the non-conformally deposited dielectric material in a second trench 47B constitutes a second cavity-containing plug structure 45B. In one embodiment, the top surface of each cavity-containing plug structure (45A, 45B) may be coplanar with the topmost surface of the contiguous node dielectric layer 44L. Each cavity-containing plug structure (45A, 45B) is formed on the contiguous node dielectric layer 44L.

While an embodiment in which each of the cavity-containing plug structures (45A, 45B) completely covers all inner surfaces of the first and second node dielectric layers (44A, 44B) is illustrated herein, embodiments are expressly contemplated herein in which the cavity-containing plug structures (45A, 45B) do not form a continuous layer at a bottom portion of one or more of the first and second node dielectric layers (44A, 44B).

Figure 5:
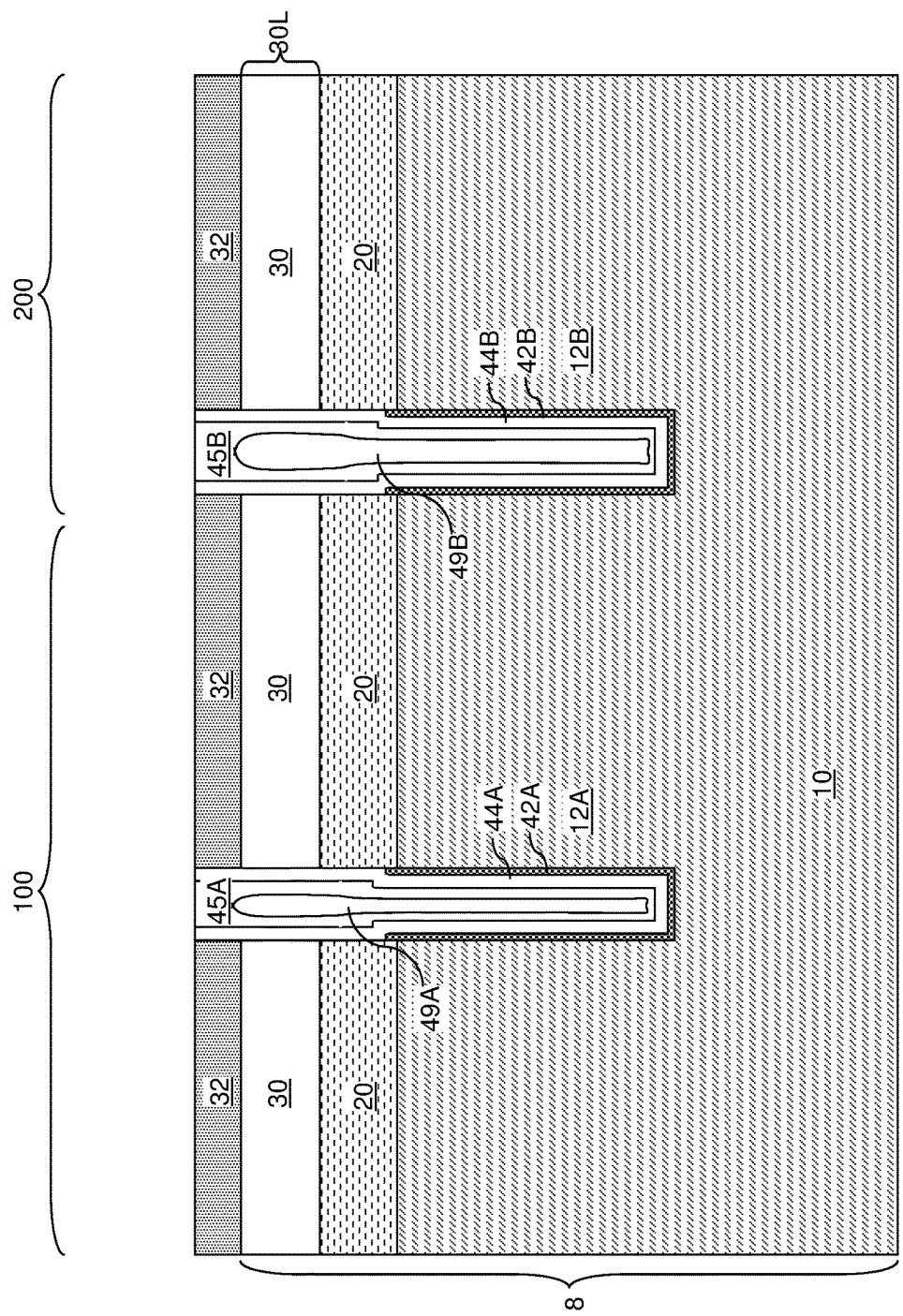
FIG. 5 is a vertical cross-sectional view of the exemplary semiconductor structure after removal of a horizontal portion of the contiguous node dielectric layer from above a top surface of the a hard mask layer according to an embodiment of the present disclosure.

Referring to FIG. 5, horizontal portions of the contiguous node dielectric layer 44L, and optionally, topmost portions of the cavity-containing plug structures (45A, 45B) can be removed by an isotropic etch, an anisotropic etch, chemical mechanical planarization (CMP), or a combination thereof. Upon removal of portions of the contiguous node dielectric layer 44L from above the top surface of the hard mask layer 32, the contiguous node dielectric layer 44L is patterned to form various node dielectric layers (44A, 44B). The various node dielectric layers (44A, 44B) include at least one first node dielectric layer 44A formed in the at least one first trench 47A in the first device region 100, and at least one second node dielectric layer 44B formed in the at least one second trench 47B in the second device region 200.

Each remaining portion of the contiguous node dielectric layer 44L in the first device region 100 constitutes a first node dielectric layer 44A. Each remaining portion of the contiguous node dielectric layer 44L in the second device region 200 constitutes a second node dielectric layer 44B. A first node dielectric layer 44A can contact all inner sidewalls of a first outer metallic layer 42A, and a second node dielectric layer 44B can contact all inner sidewalls of a second outer metallic layer 42B. The at least one first node dielectric layer 44A and the at least one second node dielectric layer 44B can have the same thickness and the same composition as the contiguous node dielectric layer 44L. Each first cavity-containing plug structure 45A is formed on a first node dielectric layer 44A, which is a first portion of the contiguous node dielectric layer 44L. Each second cavity-containing plug structure 45B is formed on a second node dielectric layer 44B, which is a second portion of the contiguous node dielectric layer 44L.

In one embodiment, horizontal portions of the contiguous node dielectric layer 44L and topmost portions of the cavity-containing plug structures (45A, 45B) can be removed by chemical mechanical planarization (CMP). In this case, the top surface of each cavity-containing plug structure (45A, 45B) may be coplanar with the top surface of the hard mask layer 32.

Figure 6:
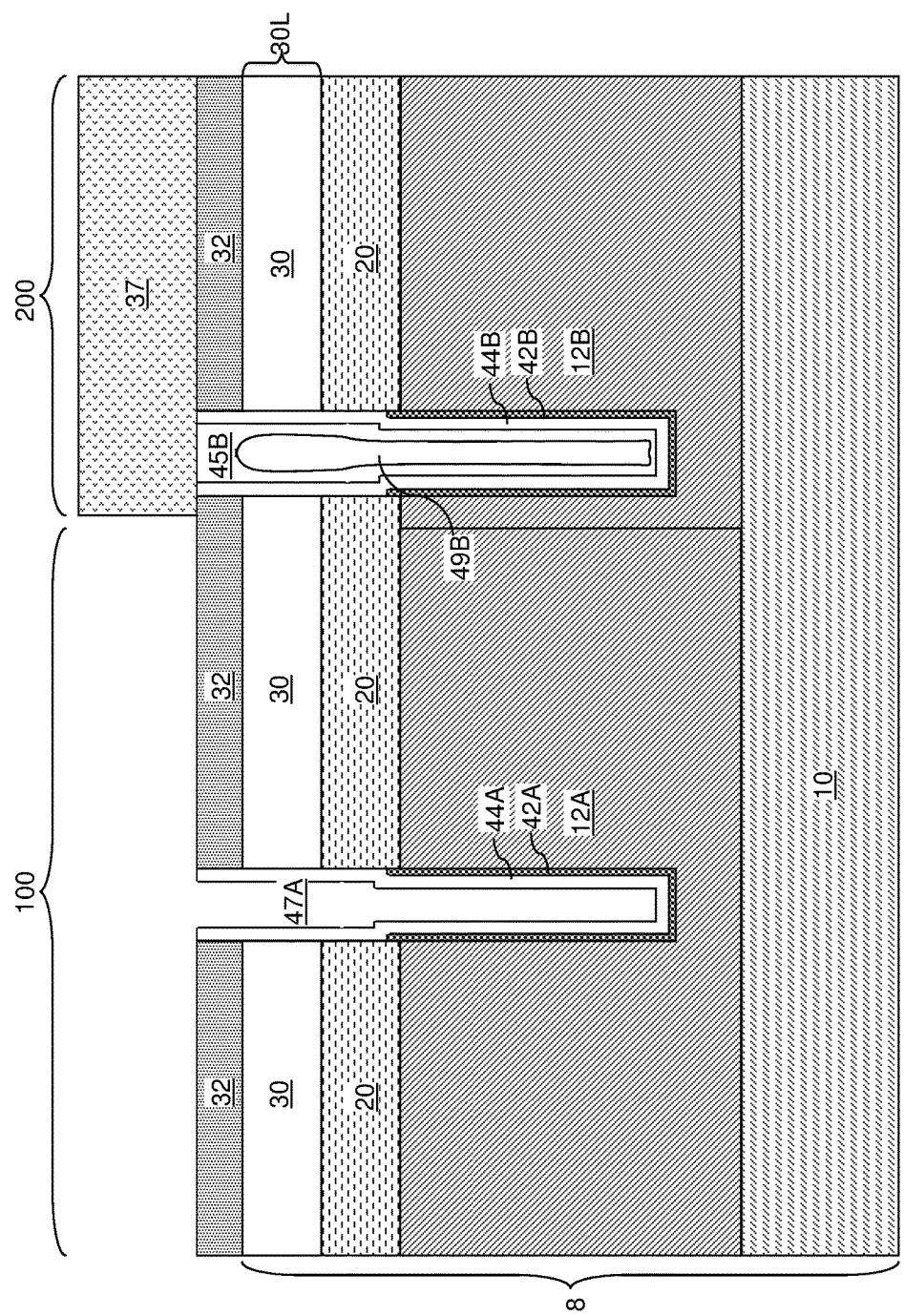
FIG. 6 is a vertical cross-sectional view of a variation of the exemplary semiconductor structure after covering a second device region with a patterned mask layer and removal of a first cavity-containing plug structure from a first device region according to an embodiment of the present disclosure.

Referring to FIG. 6. a patterned mask layer 37 can be formed over the hard mask layer 32 such that the patterned mask layer 37 covers the second device region 200 and does not cover the first device region 100. In one embodiment, the patterned mask layer 37 can be a patterned photoresist layer. In this case, a blanket (unpatterned) photoresist layer can be applied over the hard mask layer 32 and lithographically patterned so that the remaining portions of the photoresist layer cover the second device region 200 and do not cover the first device region 100. Each of the at least one second cavity-containing plug structure 45B is masked with the patterned mask layer 37, while each of the at least one first cavity-containing plug structure 45A (See FIG. 5) is not masked by the patterned mask layer 37.

Each first cavity-containing plug structure 45A can be removed employing an etch process while the patterned mask layer 37 protects the at least one second cavity-containing plug structure 45B during the etch process. The etch process that removes the material of the at least one first cavity-containing plug structure 45A can be selective to, i.e., can avoid any substantial etching of, the materials of the hard mask layer 32 and optionally the at least one first node dielectric layer 44A. The patterned mask layer 37 functions as an etch mask during the etch process. In one embodiment, the hard mask layer 32 can include silicon nitride, the buried insulator layer 20 can include undoped silicate glass or thermal silicon oxide, the non-conformally deposited material can be borosilicate glass (BSG), and the etch process can be a wet etch process employing dilute hydrofluoric acid. The inner surfaces of a first node dielectric layer 44A are physically exposed within each first cavity 47A. The patterned mask layer 37 may, or may not, be removed after removal of the at least one first cavity-containing plug structure 45A. In one embodiment, the etch chemistry of the etch process that removes the at least one first cavity-containing plug structure 45A can be selective to the dielectric material of the at least one first node dielectric layer 44A.

Figure 7:
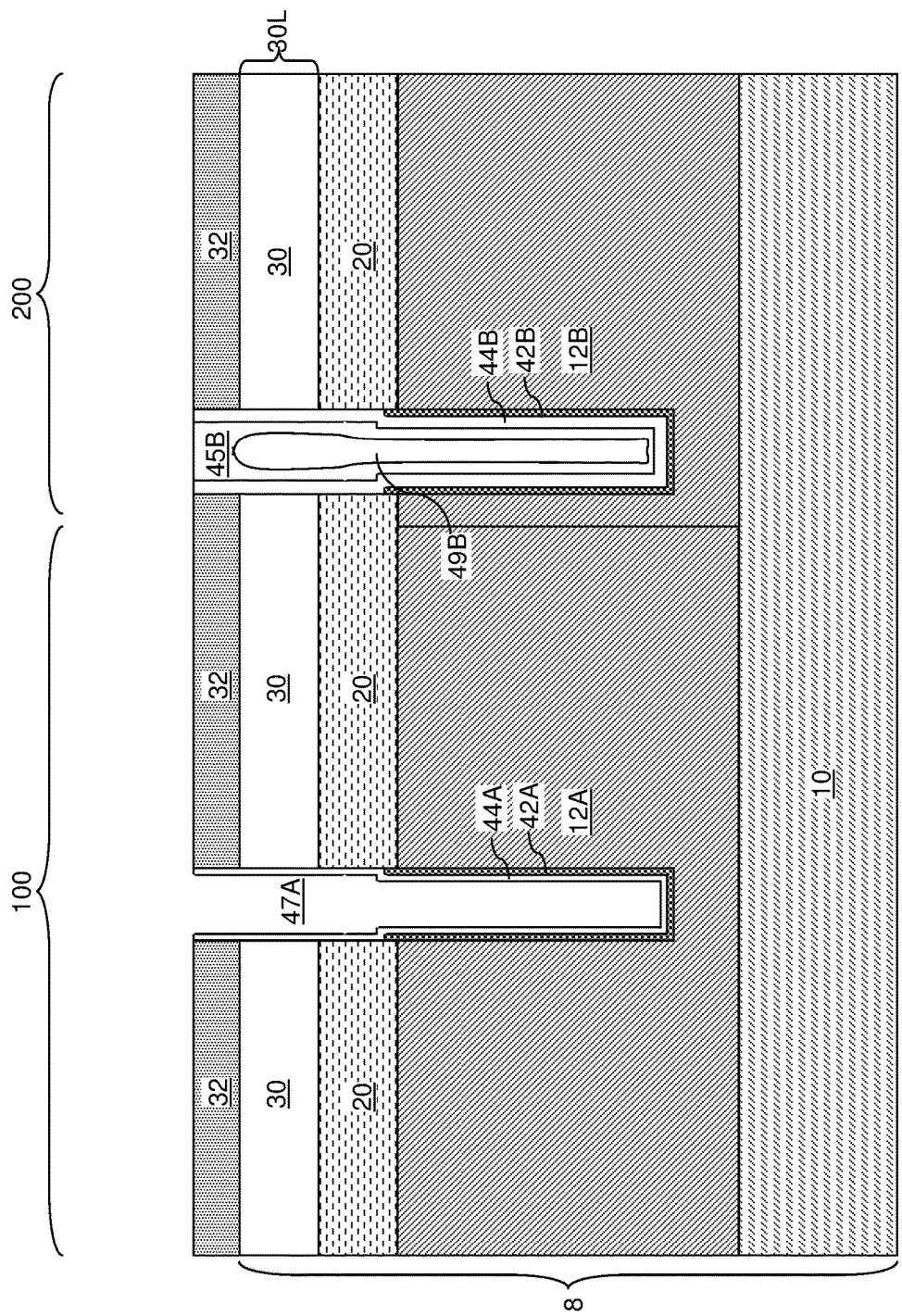
FIG. 7 is a vertical cross-sectional view of the variation of the exemplary semiconductor structure after thinning the first node dielectric layer in the first deep trench according to an embodiment of the present disclosure.

Referring to FIG. 7, after removal of the at least one first cavity-containing plug structure 45A (See FIG. 6), each of the at least one first node dielectric layer 44A is exposed to another etch process, while the at least one second cavity-containing plug structure 45B within the at least one second trench 47B prevents the at least one second node dielectric layer 44B from exposure to the etchants of the etch process. If the patterned mask layer 37 (See FIG. 6) is present at this processing step, the patterned mask layer 37 may provide additional protection for the at least one second node dielectric layer 44B from the etchants of the etch process. In other words, the at least one second cavity-containing plug structure 45B and any remaining portion of the patterned mask layer 37, if present, prevents etching of the at least one second node dielectric layer 44B within the at least one second trench 47B.

The etch process can be an isotropic etch process that etches the dielectric material of the at least one first node dielectric layer 44A. Thus, the at least one first node dielectric layer 44A in the at least one first trench 47A can be thinned by the isotropic etch process, while the at least one second node dielectric layer 44B in the at least one second trench 47B is not thinned due to the presence of the at least one second cavity-containing plug structure 45B and, if present, due to the presence of the patterned mask layer 37. The etch chemistry for the isotropic etch of the dielectric material of the at least one first node dielectric layer 44A can be selected from etch chemistries known in the art. The isotropic etch process can be terminated while each remaining portion of each first node dielectric layer 44A is a contiguous dielectric material layer without any hole therein and contacting all inner sidewalls of a first outer metallic layer 42A.

As discussed above, each of the at least one first node dielectric layer 44A is a first portion of the contiguous node dielectric layer 44L in a first trench 47A, and each of the at least one second node dielectric layer 44B is a second portion of the contiguous node dielectric layer 44L in a second trench 47B. The at least one first node dielectric layer 44A as thinned has a lesser thickness than the thickness of the at least one second node dielectric layer 44B, which has the same thickness as the thickness of the contiguous node dielectric layer 44L (See FIG. 3). The thickness of the at least one first node dielectric layer 44A as thinned is herein referred to as a thinned node dielectric thickness or a second node dielectric thickness, and the thickness of the at least one second node dielectric layer 44B is herein referred to as an unthinned node dielectric thickness or a first node dielectric thickness. In one embodiment, the first node dielectric thickness can be in a range from 3 nm to 12 nm, and the second node dielectric thickness can be in a range from 1.5 nm to 6 nm, although lesser and greater thicknesses can also be employed. Any remaining portion of the patterned mask layer 37 can be removed, for example, by ashing.

Figure 8:
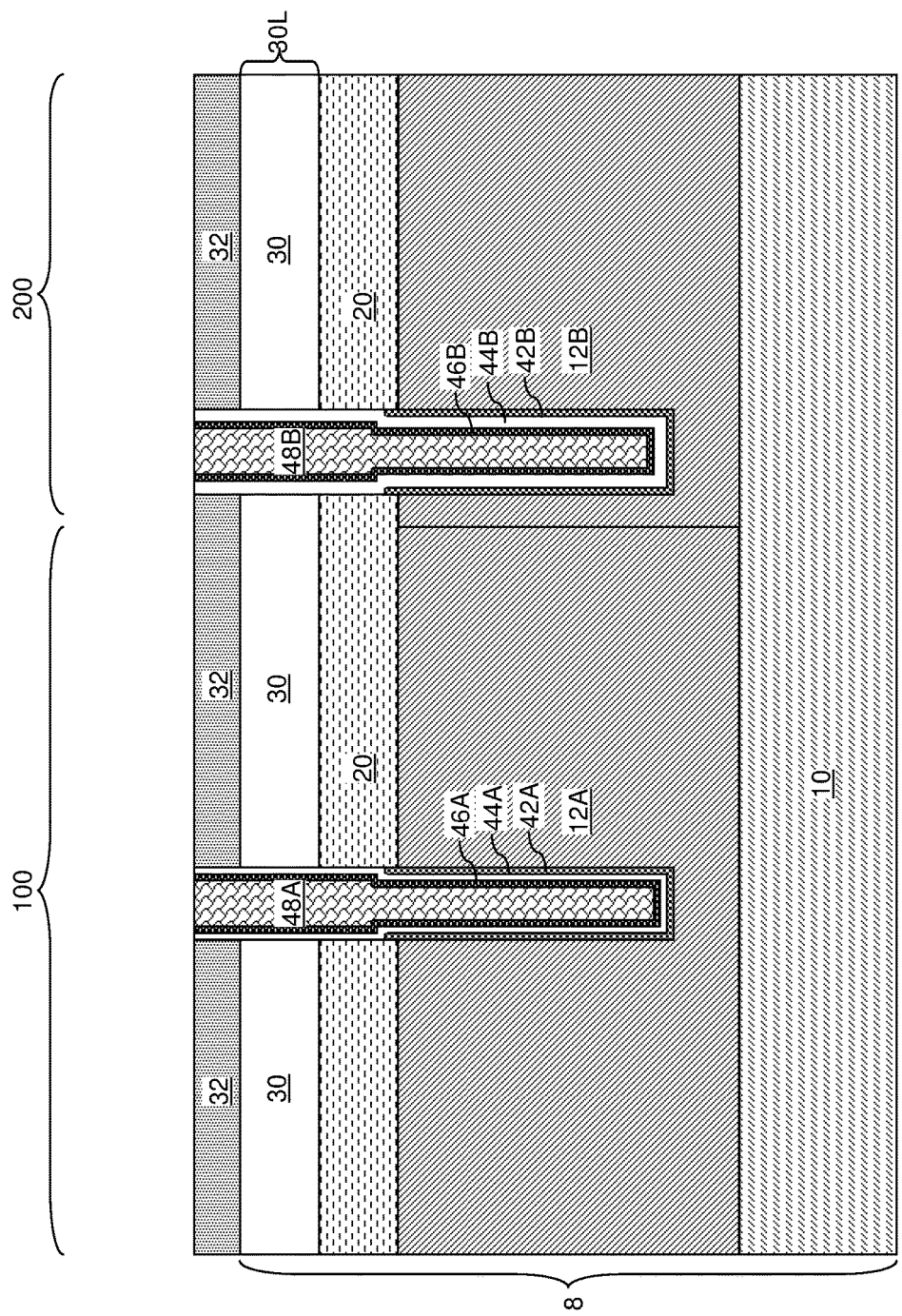
FIG. 8 is a vertical cross-sectional view of the exemplary semiconductor structure after removal of a second cavity-containing plug structure and formation of inner metallic layers and conductive fill portions according to an embodiment of the present disclosure.

Referring to FIG. 8, the at least one second cavity-containing plug structure 45B can be removed employing an etch process. The etch process that removes the material of the at least one second cavity-containing plug structure 45B can be selective to the materials of the hard mask layer 32, the contiguous semiconductor material portion 30, the buried insulator layer 20, and the first and second node dielectric layers (44A, 44B). In one embodiment, the hard mask layer 32 can include silicon nitride, the buried insulator layer 20 can include undoped silicate glass or thermal silicon oxide, the at least one second cavity-containing plug structure 45B can include borosilicate glass (BSG), and the etch process can be a wet etch process employing dilute hydrofluoric acid. The inner surfaces of a second node dielectric layer 44B are physically exposed within each second cavity 47B.

A second metallic material is deposited as a contiguous layer on sidewalls of the first and second node dielectric layers (44A, 44B). The second metallic material may be the same as, or different from, the first metallic material of the first and second outer metallic layers (42A, 44B). In one embodiment, the second metallic material can include an elemental metal, an alloy of at least two elemental metals, a conductive metallic nitride of an elemental metal, or a conductive metallic nitride of an alloy of at least two elemental metals. In one embodiment, the second metallic material can consist essentially of an elemental metal, an alloy of at least two elemental metals, a conductive metallic nitride of an elemental metal, or a conductive metallic nitride of an alloy of at least two elemental metals. In one embodiment, the second metallic material can include Ti, Ta, W, TiN, TaN, WN, an alloy thereof, and/or a combination thereof. In one embodiment, the second metallic material can consist essentially of Ti, Ta, W, TiN, TaN, WN, an alloy thereof, or a combination thereof. In one embodiment, the second metallic material can be deposited employing a conformal deposition method such as chemical vapor deposition (CVD) or atomic layer deposition (ALD). In one embodiment, the entirety of the contiguous layer including the second metallic material can be conformal, i.e., has the same thickness throughout. The thickness of the contiguous layer of the second metallic layer, i.e., the second contiguous metallic layer, can be in a range from 5 nm to 30 nm, although lesser and greater thicknesses can also be employed.

A conductive material layer is deposited on the second contiguous metallic layer to completely fill the first and second trenches (47A, 47B; See FIG. 1). The conductive material layer includes a conductive material, which can be a metallic material and/or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material layer can be deposited by physical vapor deposition (PVD), chemical vapor deposition (CVD), electroplating, electroless plating, or a combination thereof. The conductive material layer is deposited to a thickness that is sufficient to completely fill the first and second trenches (47A, 47B).

The portions of the conductive material layer and the second contiguous metallic layer above a horizontal plane including the top surface of the hard mask layer 32 can be removed by chemical mechanical planarization (CMP), a recess etch, or a combination thereof. In one embodiment, the remaining portions of the conductive material layer and the second contiguous metallic layer can be present only below the horizontal plane including the top surface of the hard mask layer 32.

Each remaining portion of the second contiguous metallic layer in a first trench 47A constitutes a first inner metallic layer 46A, and each remaining portion of the second contiguous metallic layer in a second trench 47B constitutes a second inner metallic layer 46B. Each first inner metallic layer 46A and each second inner metallic layer 46B includes the second conductive material and have a same thickness, which is herein referred to as a second thickness, and a same composition, which is herein referred to as a second composition. Each remaining portion of the conductive material layer in a first trench 47A constitutes a first conductive material portion 48A, and each remaining portion of the conductive material layer in a second trench 47B constitutes a second conductive material portion 48B. In one embodiment, the top surfaces of each first inner metallic layer 46A, each second inner metallic layer 46B, each first conductive material portion 48A, and each second conductive material portion 48B can be coplanar with the top surfaces of the hard mask layer 32.

Figure 9:
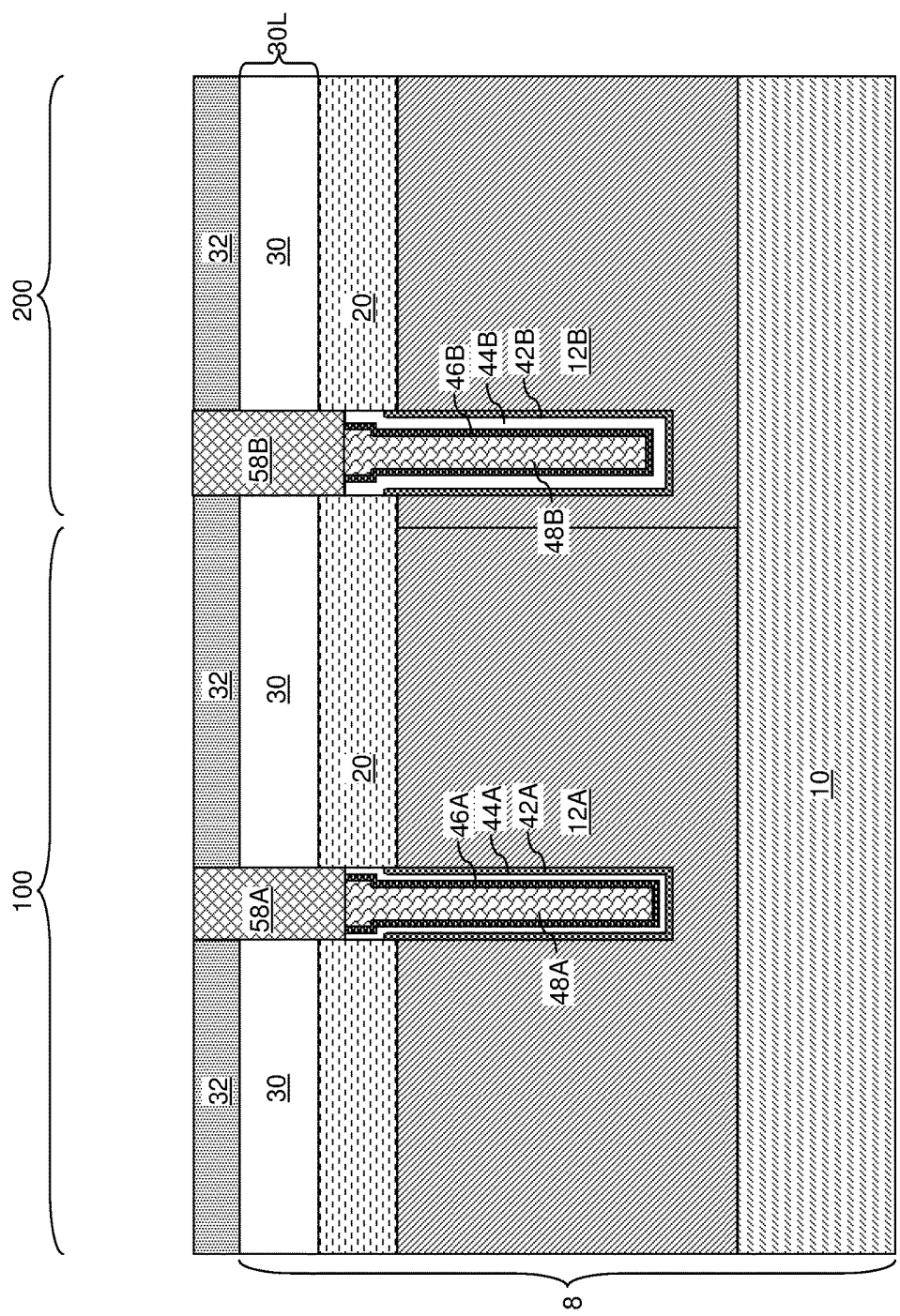
FIG. 9 is a vertical cross-sectional view of the exemplary semiconductor structure after recessing the conductive fill portions, inner metallic layers, and node dielectric layers, and formation of buried strap structures according to an embodiment of the present disclosure.

Referring to FIG. 9, the conductive material portions (48A, 48B), the inner metallic layers (46A, 46B), and the node dielectric layers (44A, 44B) can be recessed by at least one etch process employing the hard mask layer 32 as an etch mask. In an illustrative example, the conductive material portions (48A, 48B) can be recessed by an anisotropic etch to a depth that is located between the top surface of the buried insulator layer 20 and the bottom surface of the buried insulator layer 20, and the inner metallic layers (46A, 46B) and the node dielectric layers (44A, 44B) can be subsequently removed by at least one isotropic etch, which can be at least one wet etch.

A conductive material is deposited within the cavities formed by the recessing of the conductive material portions (48A, 48B), the inner metallic layers (46A, 46B), and the node dielectric layers (44A, 44B). The conductive material can include at least one doped semiconductor material such as doped polysilicon and/or at least one metallic material. Excess portions of the conductive material can be removed from above the top surface of the hard mask layer 32 by chemical mechanical planarization. Each remaining portion of the conductive material in a first trench 47A (See FIG. 1) constitutes a first buried strap structure 58A that provides an electrically conductive path to the contiguous semiconductor material portion 30. Each remaining portion of the conductive material in a second trench 47A (See FIG. 1) constitutes a second buried strap structure 58B that provide an electrically conductive path to the contiguous semiconductor material portion 30.

Figure 10:
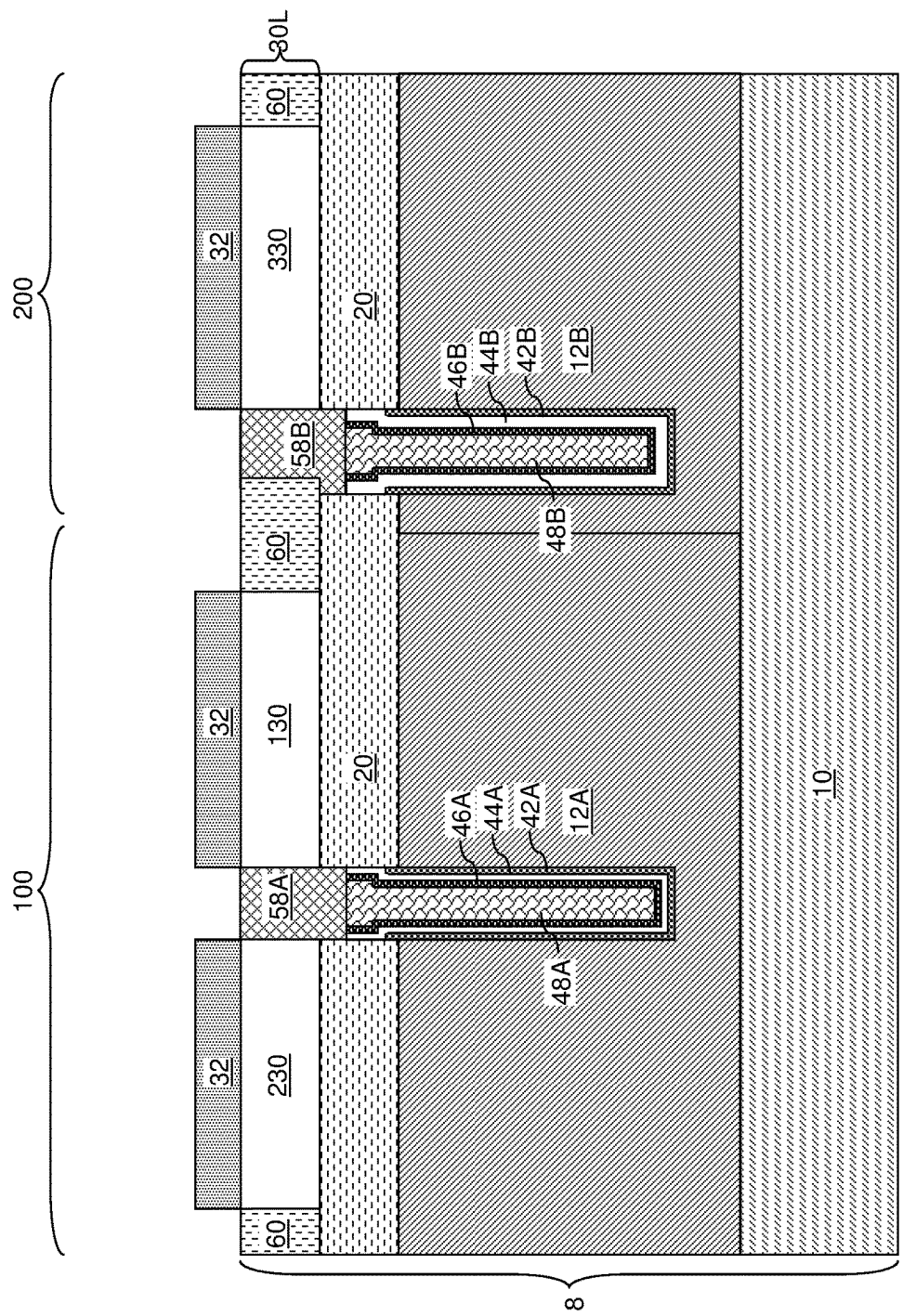
FIG. 10 is a vertical cross-sectional view of the exemplary semiconductor structure after formation of shallow trench isolation structures and recessing of the conductive fill portions according to an embodiment of the present disclosure.

Referring to FIG. 10, a shallow trench isolation structure 60 can be formed in the top semiconductor layer 30L. For example, a photoresist layer (not shown) can be applied to the top surface of the hard mask layer 32, and is lithographically patterned to form a contiguous opening in areas in which the shallow trench isolation structure 60 can be formed. The remaining portions of the photoresist layer can be discrete and disjoined photoresist portions that are laterally spaced from one another by a contiguous space. The contiguous space separates the various patterned portions of the photoresist layer. The portions of the hard mask layer 32, the first and second inner metallic layers (46A, 46B), and the first and second conductive material portions (48A, 48B) that are not covered by the patterned portions of the photoresist layer can be etched by an anisotropic etch to form a contiguous shallow trench. In one embodiment, the anisotropic etch can proceed until the top surface of the buried insulator layer 20 is physically exposed at the bottom of the contiguous shallow trench. The contiguous shallow trench can be filled with a dielectric material such as silicon oxide, silicon nitride, and/or a dielectric metal oxide. The dielectric material can be planarized employing the top surface of the hard mask layer as a stopping layer during the planarization process. Subsequently, the dielectric material can be recessed to a height about the top surface of the top semiconductor layer 30L. The remaining portion of the deposited dielectric material constitutes the shallow trench isolation structure 60, which can be a contiguous structure laterally surrounding isolated remaining portions of the contiguous semiconductor material portion 30.

The remaining portions of the contiguous semiconductor material portion 30 can include multiple semiconductor material portions in the first device region 100 and additional multiple semiconductor material portions in the second device region 200. In one embodiment, the remaining portions of the contiguous semiconductor material portion 30 can include, for example, a first semiconductor material portion 130 and a second semiconductor material portion 230 that are formed in the first device region 100, and a third semiconductor material portion 330 that is formed in the second device region 200.

Figure 11:
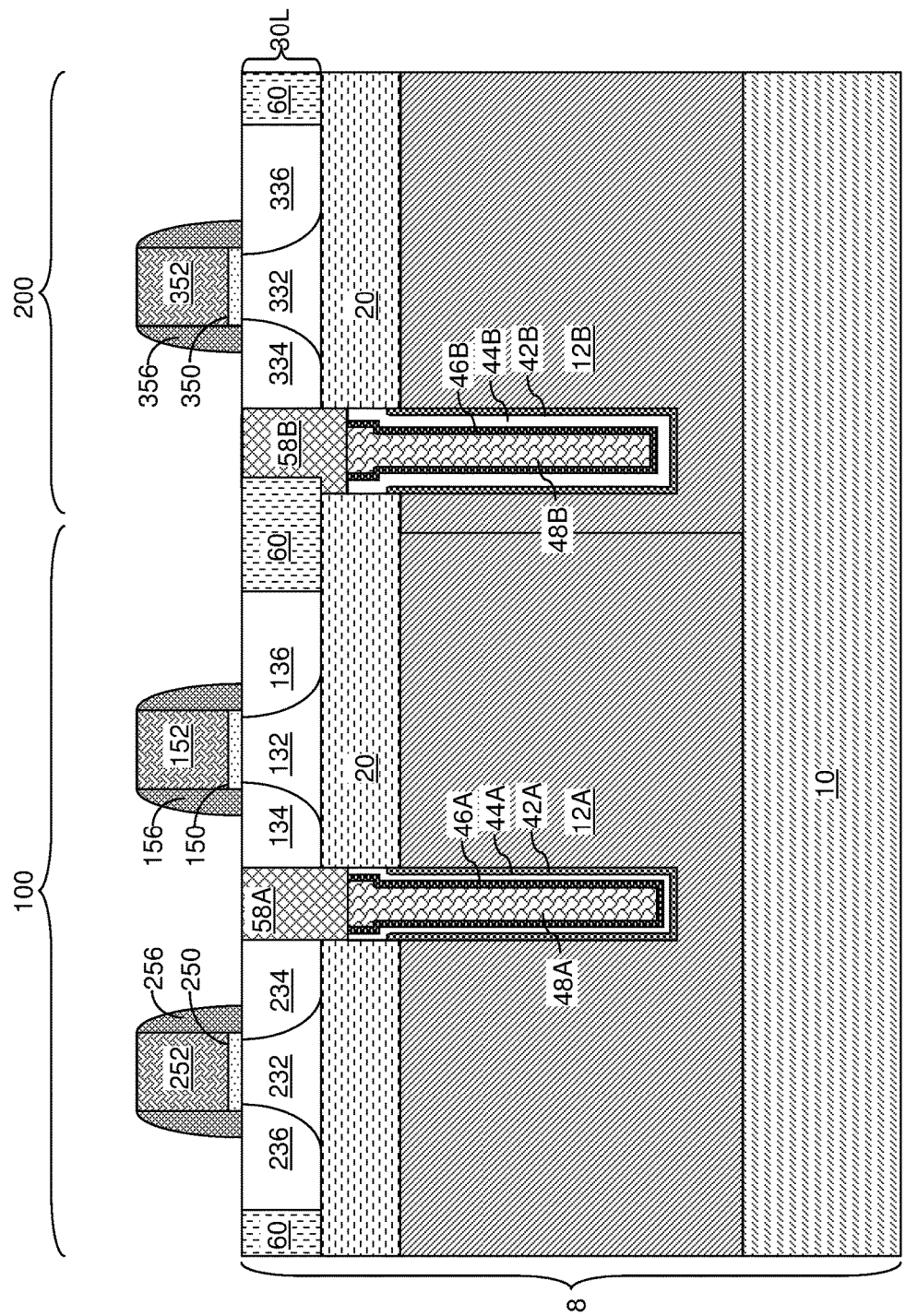
FIG. 11 is a vertical cross-sectional view of the exemplary semiconductor structure after formation of various field effect transistors according to an embodiment of the present disclosure.

Referring to FIG. 11, various field effect transistors can be formed on the semiconductor material portions (130, 230, 330) employing any method known in the art. For example, a first gate stack (150, 152) including a first gate dielectric 150 and a first gate electrode 152 can be formed over the first semiconductor material portion 130 (See FIG. 10), a second gate stack (250, 252) including a second gate dielectric 250 and a second gate electrode 252 can be formed over the second semiconductor material portion 230 (See FIG. 10), and a third gate stack (350, 352) including a third gate dielectric 350 and a third gate electrode 352 can be formed over the third semiconductor material portion 330 (See FIG. 10) employing method known in the art. A first source region 134, a first drain region 236, and a first body region 132 can be formed within the first semiconductor material portion 130, a second source region 234, a second drain region 236, and a second body region 232 can be formed within the second semiconductor material portion 230, and a third source region 334, a third drain region 236, and a third body region 332 can be formed within the third semiconductor material portion 330 employing methods known in the art. Gate spacers (156, 256, 356) can be formed around each of the gate stacks (150, 152, 250, 252, 350, 352) employing methods known in the art. While a gate first integration scheme is illustrated herein, a replacement gate integration scheme as known in the art can be employed to form the field effect transistors.

In general, a first switching device can be formed on the first semiconductor material portion 130 (See FIG. 10), a second switching device can be formed on the second semiconductor material portion 230 (See FIG. 10), and a third switching device can be formed on the third semiconductor material portion 330. As used herein, a "switching device" refers to a semiconductor device that provides alternate configurations selected from a connection state in which a first node is electrically shorted to a second node and an isolation state in which the first node is electrically isolated from the second node. Examples of switching devices include, but are not limited to, a field effect transistor, a bipolar junction transistor, a thyristor, and other types of transistors known in the art. The first and second switching devices can provide electrical connection or disconnection of a node (e.g., the first drain region 136 or the second drain region 236) from the node of an inner electrode (46A, 48A, 58A) of a first deep trench capacitor (12A, 42A, 44A, 46A, 48A, 58A) in a first trench 47A (See FIG. 1). The third switching device can provide electrical connection or disconnection of a node (e.g., the third drain region 336) from the node of an inner electrode (46B, 48B, 58B) of a second deep trench capacitor (12B, 42B, 44B, 46B, 48B, 58B) in a second trench 47B (See FIG. 1).

Figure 12:
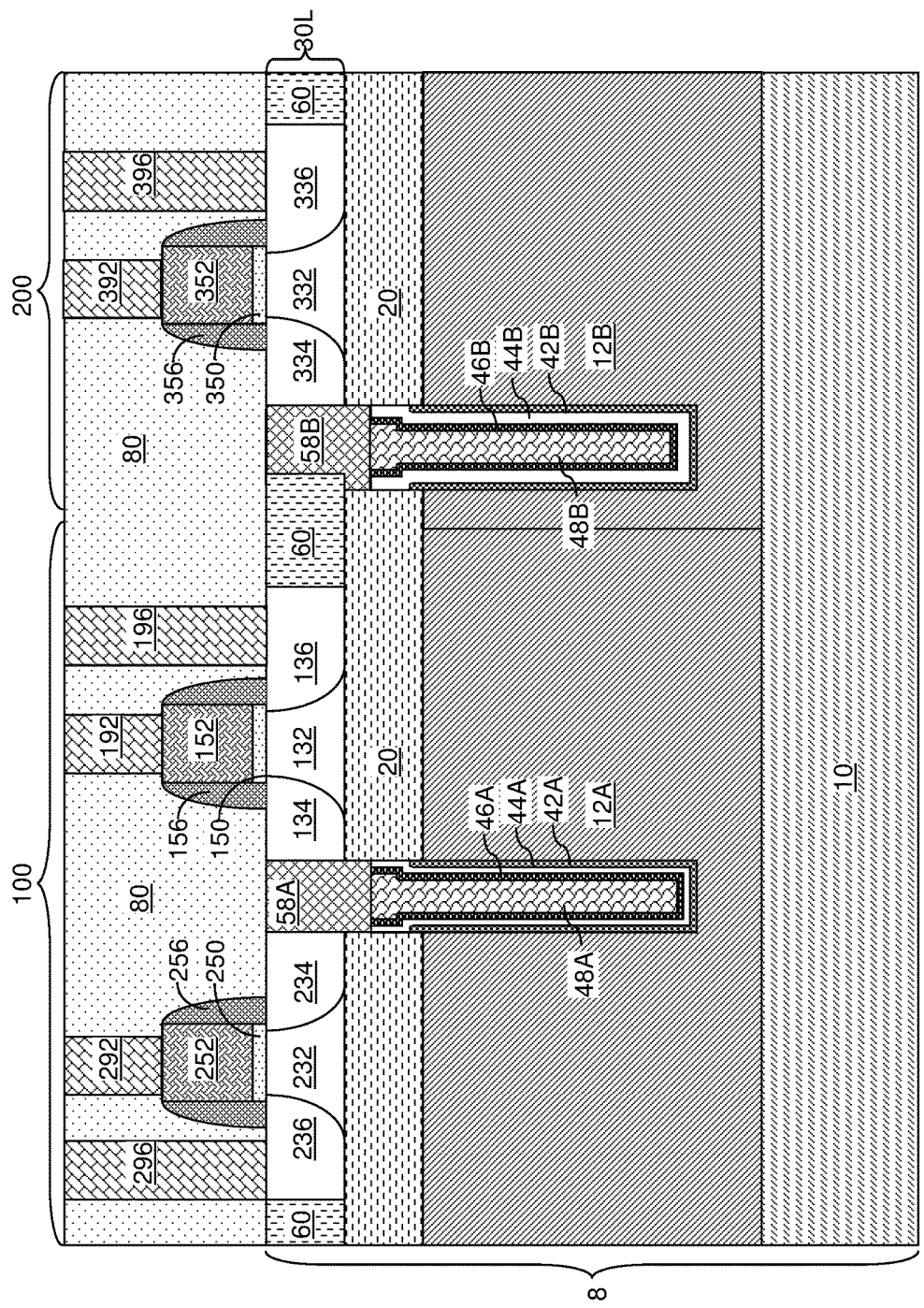
FIG. 12 is a vertical cross-sectional view of the exemplary semiconductor structure after formation of a contact level dielectric layer and various contact via structures according to an embodiment of the present disclosure.

Referring to FIG. 12, a contact level dielectric layer 80 can be formed over the switching devices in the first and second device regions (100, 200) employing methods known in the art. Various contact via structures (192, 196, 292, 296, 392, 396) can be formed to provide electrically conductive paths to various nodes of the switching devices (such as the first gate electrode 152, the first drain region 136, the second gate electrode 252, the second drain region 236, the third gate electrode 353, and the third drain region 336.

Figure 13:
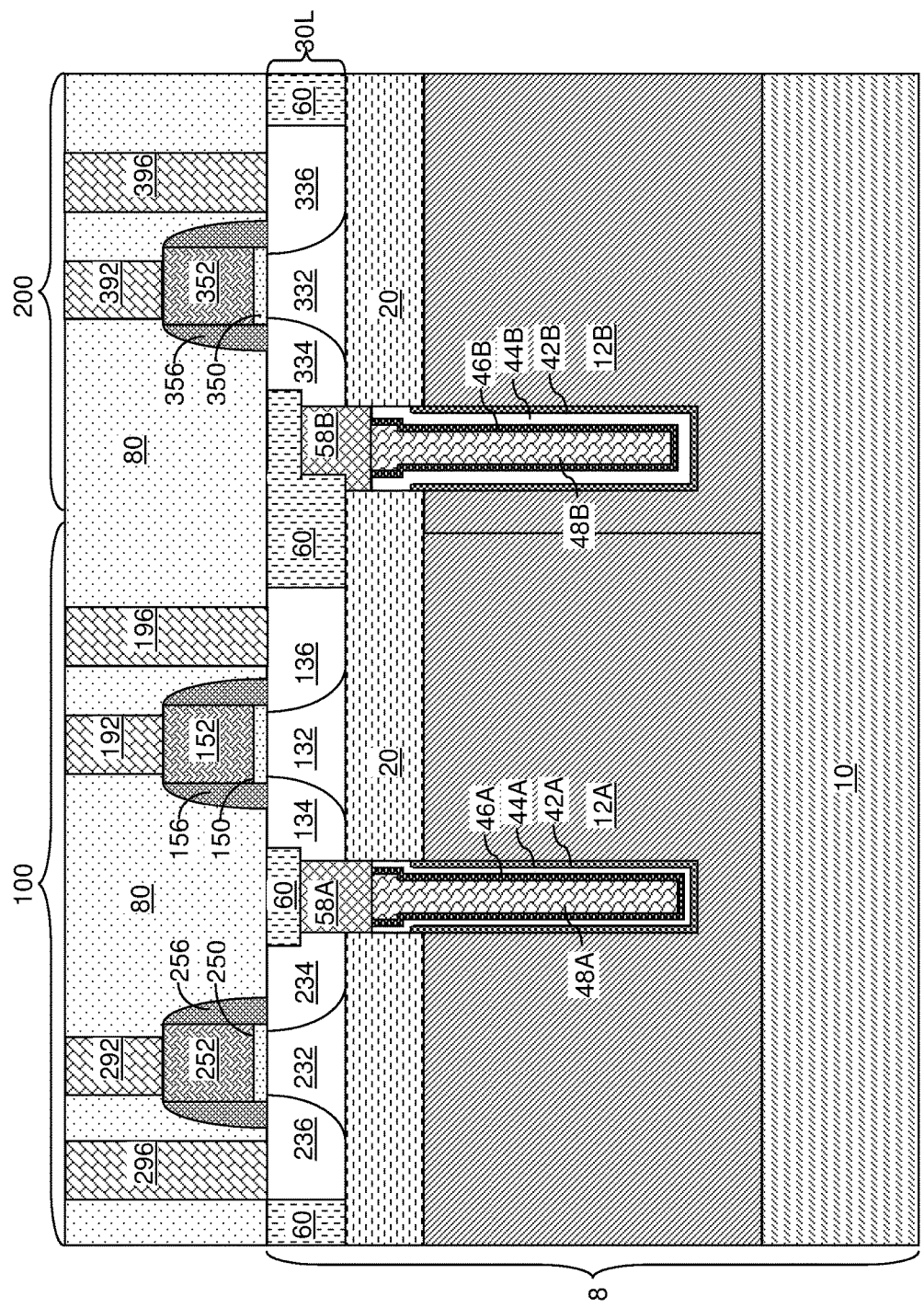
FIG. 13 is a vertical cross-sectional view of a variation of the exemplary semiconductor structure according to an embodiment of the present disclosure.

Referring to FIG. 13, a variation of the exemplary semiconductor structure is illustrated in which the shape of the shallow trench isolation structure 60 is modified to include multiple depths at various portions of the shallow trench isolation structure 60. For example, the shallow trench isolation structure 60 can be modified to recess top portions of the inner electrodes (46A, 48A, 58A, 46B, 48B, 58B) of the deep trench capacitors below the top surface of the top semiconductor layer 30L, while maintaining electrically conductive paths between the inner electrodes (46A, 48A, 58A, 46B, 48B, 58B) of the deep trench capacitors and various nodes of the switching devices in the first and second device regions (100, 200).

The set of device elements located in the first device region 100 collectively constitutes components a non-volatile memory device, and the set of device elements located in the second device region 200 collectively constitutes a volatile memory device. Specifically, the non-volatile memory device can be a non-volatile resistive memory device in which the stored information is embodied in the state of the first node dielectric layer 44A in terms of the leakage level, and the volatile memory device can be a dynamic random access memory (DRAM) device employing a deep trench capacitor as a charge storage device. The DRAM device can operate employing the operational principle for a DRAM device as known in the art. The operational principle of the non-volatile resistive memory device is illustrated in FIG. 14.

Figure 14:
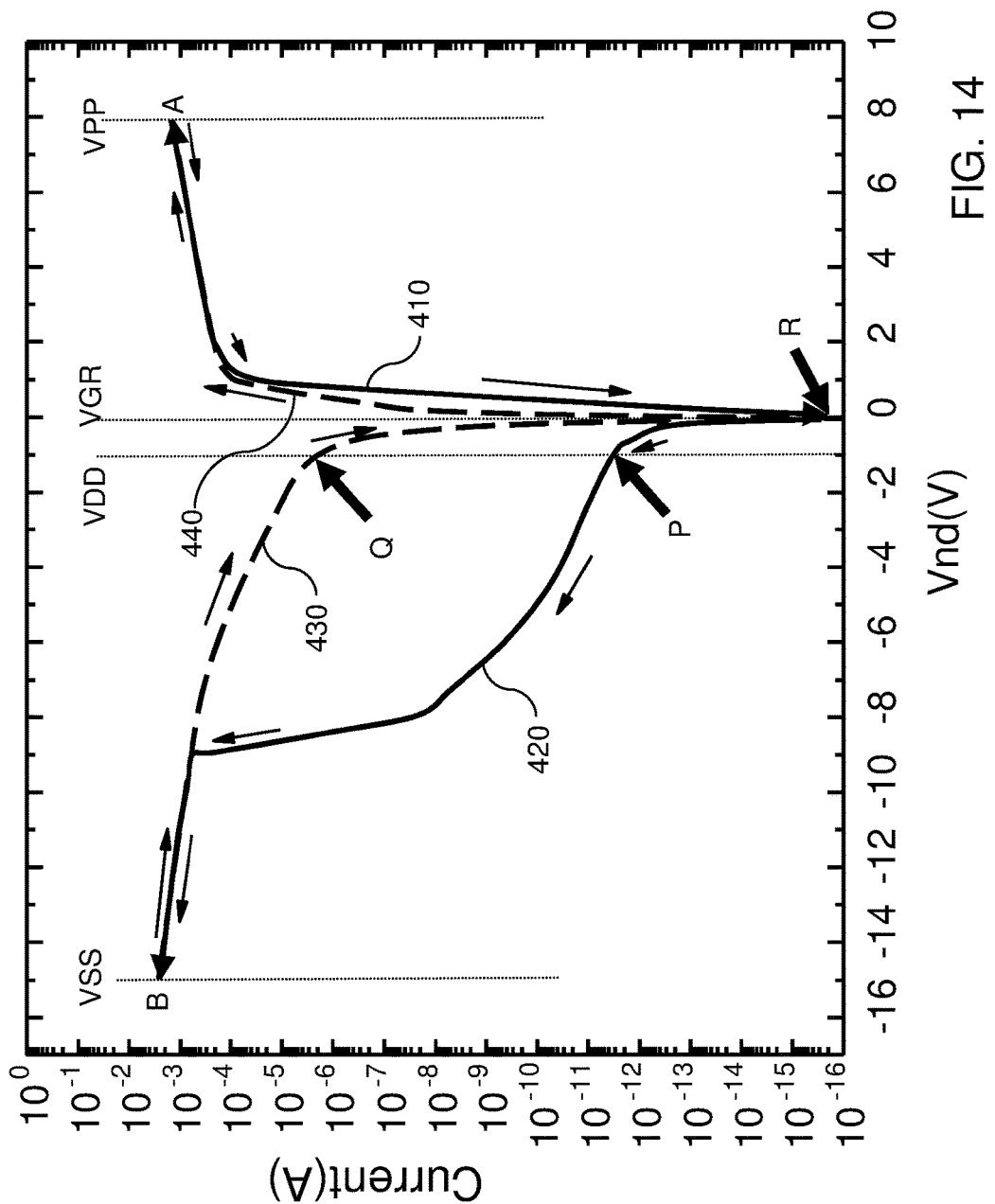
FIG. 14 is a graph illustrating the relationship between the applied voltage across the first node dielectric layer and the leakage current through the first node dielectric layer according to an embodiment of the present disclosure.

FIG. 14 is a graph illustrating hysteresis effect in the leakage current through a capacitor structure including a stack of layers including a bottom metallic layer (corresponding to a first outer metallic layer 42A in the exemplary semiconductor structure of the present disclosure) including 10 nm thick titanium nitride, a node dielectric layer including 6 nm thick hafnium silicate (corresponding to a first node dielectric layer 44A in the exemplary semiconductor structure of the present disclosure), and an upper metallic layer including 10 nm thick titanium nitride (corresponding to a first inner metallic layer 46A in the exemplary semiconductor structure of the present disclosure). The total area of the capacitor structure was $8.5 \times 10^{-7}$ mm$^2$ per each deep trench capacitor.

The capacitor structure was subjected to operating conditions in which an electrical voltage bias was applied across the node dielectric layer. The outer metallic layer was electrically grounded, and the node dielectric bias voltage Vnd was applied to the upper metallic layer while the lower metallic layer was electrically grounded. First, the node dielectric bias voltage was increased from 0 V to a positive power supply voltage VPP (which was +8V). Data generated at this step is not presented in FIG. 14, and does not matter as far as the operational principle of the non-volatile resistive memory device of the present disclosure is concerned for reasons discussed below. The operating condition at this point is represented by point A. The leakage current through the node dielectric layer was measured as the node dielectric bias voltage Vnd was decreased from the positive power supply voltage VPP to 0 V to generate a first curve 410. The operating condition at the end of generation of the first curve 410 corresponds to point R. Then, the leakage current through the node dielectric layer was measured as the node dielectric bias voltage Vnd was decreased from 0 V to the negative power supply voltage VSS (which was −15 V) to generate a second curve 420. The operating condition at the end of the generation of the second curve 420 corresponds to point B. Then, the leakage current through the node dielectric layer was measured as the node dielectric bias voltage Vnd was increased from the negative power supply voltage VSS to 0V to generate a third curve 430. The operating condition at the end of generation of the third curve 430 corresponds to point R. Then, the leakage current through the node dielectric layer was measured as the node dielectric bias voltage Vnd was increased from 0 V to a positive power supply voltage VPP to generate a fourth curve 440. The operating condition at the end of the generation of the fourth curve 440 corresponds to point A.

The hysteresis effect in the leakage current observed in the graph of FIG. 14 is due to formation of leakage path filaments in the node dielectric layer during the decrease in the node dielectric bias voltage Vnd from about −8 V to about −9 V at the step corresponding to the second curve 420. The leakage path filaments are not present during the voltage sweep in which the node dielectric bias voltage Vnd decreases from the positive power supply voltage VPP to about −8 V. As the node dielectric bias voltage Vnd decreases from about −8 V to about −9 V, the leakage path filaments form within the node dielectric layer. The leakage path filaments are contiguous paths providing a low electrical-resistance conduit for charged particles to travel through. The leakage path filaments are formed by lining up oxygen defects or metal atoms when voltage is applied across the two plates. Formation of the leakage path filaments can induce an increase in the leakage current by several orders of magnitude.

During the decrease in the node dielectric bias voltage Vnd from about −9 V to the negative power supply voltage VSS, the density of the leakage path filaments does not substantially change because the density of the leakage path filaments becomes saturated at about −9 V. The density of the leakage path filaments does not substantially change as the node dielectric bias voltage Vnd from the negative power supply voltage VSS to about +1 V. Once the node dielectric bias voltage Vnd increases above +1 V, the density of the leakage path filaments decreases. By the time the node dielectric bias voltage Vnd increases to the positive power supply voltage VPP, the entire leakage path filaments disappear because the voltage bias applied in a direction adverse to the condition that created the original leakage path filaments induce elimination of the defects in the node dielectric layer that constituted the leakage path filaments.

The area within the four curves (410, 420, 430, 440) represents conditions in which less than the full density of the leakage path filaments is present within the node dielectric layer. Thus, irrespective of the initial condition of the node dielectric layer, the path that indicates the state of the node dielectric layer as the node dielectric bias voltage Vnd increases from 0 V to the positive power supply voltage VPP must fall between the first curve 410 and the fourth curve 440. Likewise, irrespective of the initial condition of the node dielectric layer, the path that indicates the state of the node dielectric layer as the node dielectric bias voltage Vnd decreases from 0 V to the negative power supply voltage VSS must fall between the second curve 420 and the third curve 430.

Further, the first curve 410 corresponds to the conditions of the node dielectric layer if the node dielectric layer does not initially contain any leakage path filaments and if the node dielectric bias voltage Vnd increases from 0 V to the positive power supply voltage VPP. The fourth curve 440 corresponds to the conditions that the node dielectric layer if the node dielectric layer initially has a maximum density of leakage path filaments and if the node dielectric bias voltage Vnd increases from 0 V to the positive power supply voltage VPP. The second curve 420 corresponds to the conditions of the node dielectric layer if the node dielectric layer does not initially contain any leakage path filaments and if the node dielectric bias voltage Vnd decreases from 0 V to the negative power supply voltage VSS. On the second curve 420, if the node dielectric bias voltage Vnd stops at another power supply voltage VDD (e.g., −1 V) that is higher than −8 V, the state of the node dielectric layer can be represented by point P. The third curve 430 corresponds to the conditions of the node dielectric layer if the node dielectric layer initially has a maximum density of leakage path filaments and if the node dielectric bias voltage Vnd increases from 0 V to the positive power supply voltage VPP. On the third curve 430, if the node dielectric bias voltage Vnd stops at another power supply voltage VDD (e.g., −1 V) that is higher than −8 V, the state of the node dielectric layer can be represented by point Q.

Thus, depending on the state of the density of the leakage path filaments in the node dielectric layer when the node dielectric bias voltage Vnd is at 0 V (corresponding to point R), upon application of a power supply voltage VDD, which is herein referred to as a measurement power supply voltage, the capacitor structure can display a state corresponding to point P (at which the density of the leakage path filament is substantially zero), or can display a state corresponding to point Q (at which the density of the leakage path filament is at maximum). The state corresponding to point P is herein referred to a low leakage state or a high resistance state for the node dielectric layer, and the state corresponding to point Q is herein referred to as a high leakage state or a low resistance state for the node dielectric layer.

The programming of the state of the node dielectric layer can be performed by selecting a first programming condition corresponding to point A or a second programming condition corresponding to point B. In other words, applying the positive power supply voltage VPP as the node dielectric bias voltage Vnd programs the node dielectric layer into a low leakage state, and applying the negative power supply voltage VSS as the node dielectric bias voltage Vnd programs the node dielectric layer into a high leakage state.

While the operation of the capacitor structure as a non-volatile resistive memory device has been described employing a particular set of polarities for applied voltages, it is understood that the capacitor structure as a non-volatile resistive memory device can operate with opposite polarities (e.g., by providing a set of mirror images of all curves of FIG. 14 with respect to the vertical axis corresponding to Vnd=0 V). Further, while a particular set of voltage values are employed in the graph of FIG. 14, it is understood that the voltages may be scaled linearly or non-linearly with the thickness of the node dielectric layer.

Referring back to FIGS. 12 and 13, a first switching device (such as the first field effect transistor including the first gate electrode 152) can be employed to connect or disconnect one of the two programming voltages, e.g., the positive power supply voltage VPP or the negative power supply voltage VSS that can be selected by a set of additional switching devices (not shown). A second switching device (such as the second field effect transistor including the second gate electrode 252) can be employed to connect the first deep trench capacitor (12A, 42A, 44A, 46A, 48A, 58A) to a leakage current measurement device.

Figure 15:
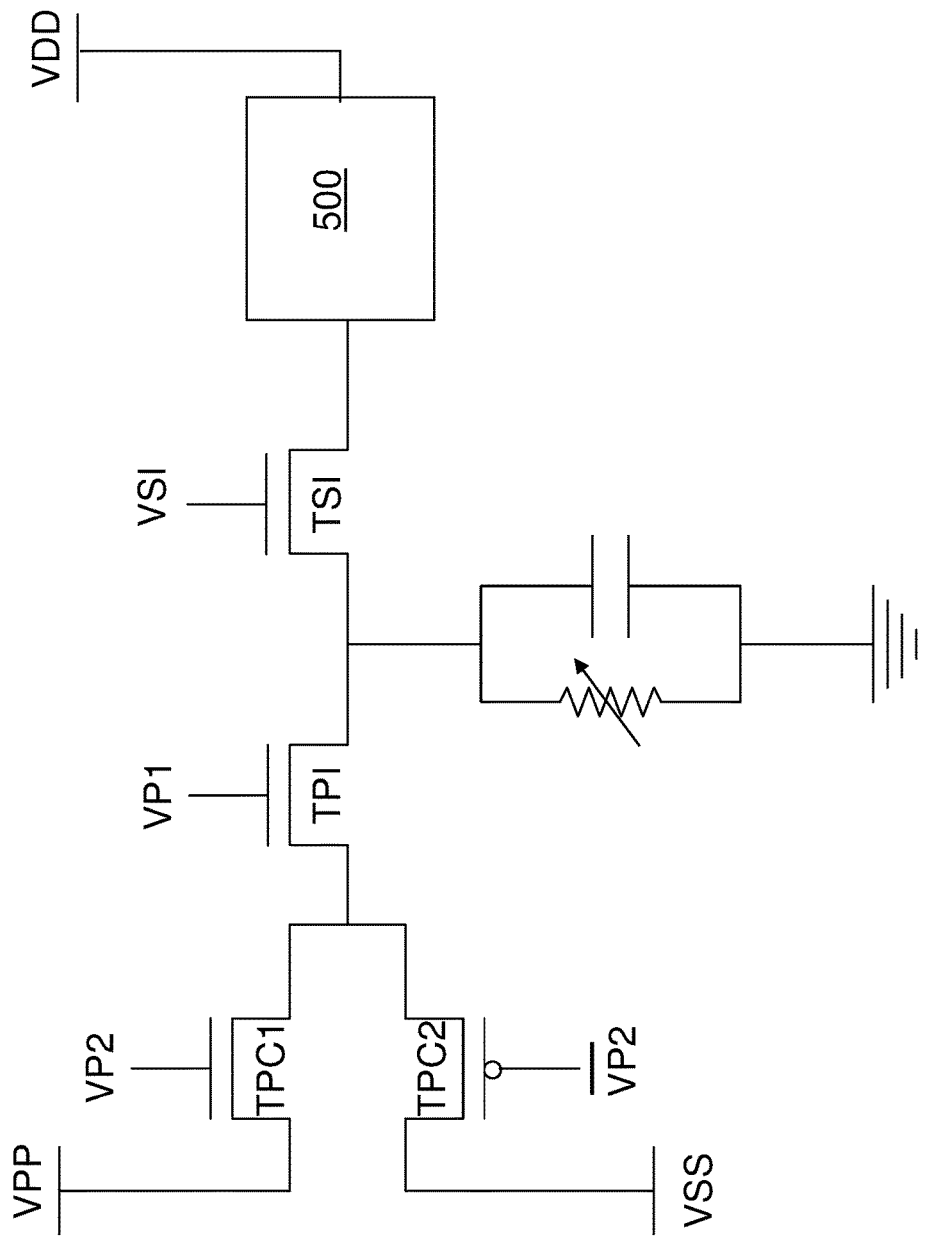
FIG. 15 is a first circuit schematic of a semiconductor circuit including a non-volatile memory device, a programming circuitry, and a sensing circuitry according to an embodiment of the present disclosure.
Figure 16:
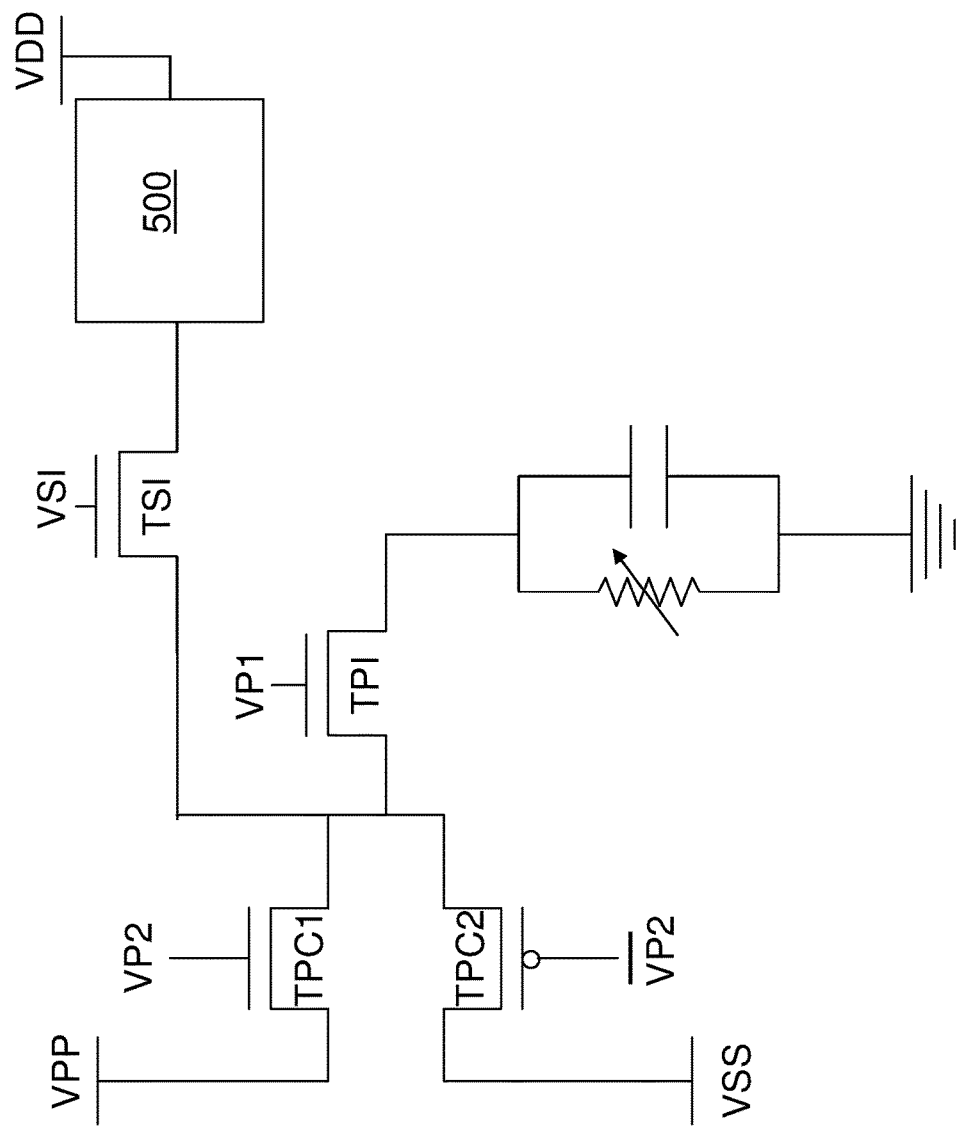
FIG. 16 is a second circuit schematic of a semiconductor circuit including a non-volatile memory device, a programming circuitry, and a sensing circuitry according to an embodiment of the present disclosure.

Referring to FIGS. 15 and 15, exemplary circuit schematics for the non-volatile resistive memory device of the present disclosure are shown. The non-volatile resistive memory device of the present disclosure can include a trench capacitor (12A, 42A, 44A, 46A, 48A, 58A; See FIGS. 12 and 13) including an outer metallic layer 42A, a node dielectric layer 44A, and an inner metallic layer 46A and located within a semiconductor substrate 8, and a set of switching devices (T1, T2, T3) configured to provide a selected state from among three states based on a set of input signals. The trench capacitor (12A, 42A, 44A, 46A, 48A, 58A; See FIGS. 12 and 13) is a capacitor that has a variable leakage path, and thus, can be represented by a parallel connection of a capacitor and a variable resistor of which the resistance can be programmed.

The three states includes a first state in which the inner metallic layer 46A is electrically shorted to a positive power supply voltage VPP (when the programming isolation transistor TPI is turned on by a first power control signal VP1, the first power supply control transistor TPC1 is turned on by a second power control signal VP2, and the second power supply control transistor TPC2 is turned off by the complement of the second power control signal VP2), a second state in which the inner metallic layer 46A is electrically shorted to a negative power supply voltage VSS (when the programming isolation transistor TPI is turned on by the first power control signal VP1, the first power supply control transistor TPC1 is turned off by the second power control signal VP2, and the second power supply control transistor TPC2 is turned on by the complement of the second power control signal VP2), and a third state in which the inner metallic layer 46A is electrically isolated from any node having the positive power supply voltage VPP and from any node having the negative power supply voltage VSS (when the programming isolation transistor TPI is turned off by the first power control signal VP1). The first transistor can be the first switching device illustrated in FIGS. 12 and 13, i.e., the first field effect transistor including the first gate electrode 152. The programming isolation transistor TPI can be turned on only during the programming of the state of the node dielectric layer 44A of the trench capacitor (12A, 42A, 44A, 46A, 48A, 58A).

The non-volatile resistive memory device of the present disclosure can further include a current measurement device 500 configured to measure leakage current through the trench capacitor (12A, 42A, 44A, 46A, 48A, 58A) under an applied bias voltage VDD that has a magnitude that is less than the magnitude of the positive power supply voltage VPP, and is less than the magnitude of the negative power supply voltage VSS.

In one embodiment, the non-volatile resistive memory device of the present disclosure can further include a sensing isolation transistor TSI. In one embodiment, the source node of the sensing isolation transistor TSI can be electrically shorted to the inner metallic layer 46A and the drain node of the sensing isolation transistor TSI can be electrically shorted to a node of the current measurement device 500 through which the leakage current flows. The sensing isolation transistor TSI can be turned on only during a sensing operation, i.e., only when the current measurement device 500 measures the leakage current through the trench capacitor (12A, 42A, 44A, 46A, 48A, 58A) in order to determine the state of the node dielectric layer 44A. The sensing isolation transistor TSI can be the second switching device illustrated in FIGS. 12 and 13, i.e., the second field effect transistor including the second gate electrode 252.

The programming isolation transistor TPI electrically isolates the power supply circuitry including the first and second power supply control transistors (TPC1, TPC2) while the trench capacitor (12A, 42A, 44A, 46A, 48A, 58A) is not in a programming mode. The first power supply control transistor TPC1 controls electrical connection or disconnection of the positive power supply voltage VPP. The second power supply control transistor TPC2 controls electrical connection or disconnection of the negative power supply voltage VSS.

The set of switching devices can include a programming isolation transistor TPI, the first power supply control transistor TPC1, and the second power supply control transistor TPC2. A source node (e.g., the first source region 134; See FIGS. 12 and 13) of the programming isolation transistor TPI can be electrically shorted to the inner metallic layer 44A, and a drain node (e.g., the first drain region 136: See FIGS. 12 and 13) of the programming isolation transistor TPI is electrically shorted to a node of the first power supply control transistor TPC1 (which includes another node connected to the positive power supply voltage VPP) and to a node of the second power supply control transistor TPC2 (which includes another node connected to the negative power supply voltage VSS).

Additional structures can be formed on the same semiconductor substrate 8 in addition to the non-volatile resistive memory device of the present disclosure. The additional structures can include, for example, a DRAM device including a second trench capacitor (12B, 42B, 44B, 46B, 48B, 58B). The first node dielectric layer 44A in the first trench capacitor (12A, 42A, 44A, 46A, 48A, 58A) within the non-volatile resistive memory device of the present disclosure can have the same material as, and can have a lesser thickness than, the second node dielectric layer 44B in the second trench capacitor (12B, 42B, 44B, 46B, 48B, 58B) within the DRAM device. Further, the first outer metallic layer 42A in the first trench capacitor (12A, 42A, 44A, 46A, 48A, 58A) within the non-volatile resistive memory device of the present disclosure can have the same composition and thickness as the second outer metallic layer 42B in the second trench capacitor (12B, 42B, 44B, 46B, 48B, 58B) within the DRAM device. In addition, the first inner metallic layer 46A in the first trench capacitor (12A, 42A, 44A, 46A, 48A, 58A) within the non-volatile resistive memory device of the present disclosure can have the same composition and thickness as the second inner metallic layer 46B in the second trench capacitor (12B, 42B, 44B, 46B, 48B, 58B) within the DRAM device.

An access transistor (such as the third field effect transistor including the third gate electrode 352 illustrated in FIGS. 12 and 13) including a source region (such as the third source region 334) can be electrically shorted to the second inner metallic layer 46A. There is no need to connect the positive power supply voltage VPP or the negative power supply voltage VSS to the negative power supply voltage VSS to the second trench capacitor (12B, 42B, 44B, 46B, 48B, 58B) within the DRAM device. Thus, the second trench capacitor (12B, 42B, 44B, 46B, 48B, 58B) within the DRAM device can be electrically isolated from any node having the positive power supply voltage VPP and from any node having the negative power supply voltage VSS. Optionally, the additional power supply voltage VDD employed to operate the current measurement device 500 can be employed as the power supply voltage to operate the access transistor for the DRAM device and/or peripheral circuits for the DRAM device.

The present invention provides a non-volatile resistive memory device and a volatile memory device (such as a DRAM) on a same semiconductor substrate 8. The non-volatile resistive memory device can store encoded information permanently once programmed, and may be reprogrammed as needed. Thus, the non-volatile resistive memory device can be operated as a rewritable permanent memory device.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
   forming a first trench and a second trench in a semiconductor substrate;
   forming a first outer metallic layer in said first trench and a second outer metallic layer in said second trench;
   forming a contiguous node dielectric layer on said first and second outer metallic layers;
   forming first and second cavity-containing plug structures on said first and second portions of said contiguous node dielectric layer, respectively, by non-conformally depositing a dielectric material in said first and second trenches such that said non-conformally deposited material forms a first cavity in said first trench and a second cavity in said second trench;
   removing said first cavity-containing plug structure from said first trench, while said second cavity-containing plug structure remains in said second trench;
   after removing said first cavity-containing plug structure, thinning a first portion of said contiguous node dielectric layer in said first trench, while a second portion of said contiguous node dielectric layer remains in said second trench without a change in thickness; and
   after thinning said first portion of said contiguous node dielectric layer, forming a first inner metallic layer and a second inner metallic layer on said first and second portions of said contiguous node dielectric layer, respectively.

2. The method of claim 1, further comprising planarizing said non-conformally deposited material, wherein remaining portions of said non-conformally deposited material in said first and second trenches constitute said first and second cavity-containing plug structures, respectively.

3. The method of claim 1, further comprising:
   masking said second cavity-containing plug structure with a patterned mask layer, while said first cavity-containing plug structure is not masked by said patterned mask layer; and
   removing said first cavity-containing plug structure employing an etch process while said patterned mask layer protects said second cavity-containing plug structure during said etch process.

4. The method of claim 3, further comprising exposing said first portion of said contiguous node dielectric layer to another etch process after removal of said first cavity-containing plug structure and while said second cavity-containing plug structure is present within said second trench.

5. The method of claim 4, wherein said another etch process isotropically etches said first portion of said contiguous node dielectric layer.

6. The method of claim 5, further comprising terminating said another etch process while a remaining portion of said first portion of said contiguous node dielectric layer is a contiguous dielectric material layer.

7. The method of claim 1, wherein said contiguous node dielectric layer comprises a material selected from a dielectric metal oxide and a dielectric silicate of at least one metallic element.

8. The method of claim 7, wherein said first outer metallic layer and said second outer metallic layer comprise a first metallic material and have a same first thickness and a same first composition, and said first inner metallic layer and said second inner metallic layer comprise a second metallic material and have a same second thickness and a same second composition.

* * * * *